United States Patent
Yang et al.

(10) Patent No.: US 8,140,900 B2
(45) Date of Patent: Mar. 20, 2012

(54) ESTABLISHING A CONNECTION BETWEEN A TESTING AND/OR DEBUGGING INTERFACE AND A CONNECTOR

(75) Inventors: Zhigang Yang, Tampere (FI); Marko Winblad, Oulu (FI); Rolf Kühnis, Vesilahti (FI)

(73) Assignee: Nokia Corporation, Espoo (FI)

( * ) Notice: Subject to any disclaimer, the term of this patent is extended or adjusted under 35 U.S.C. 154(b) by 195 days.

(21) Appl. No.: 12/456,428

(22) Filed: Jun. 15, 2009

(65) Prior Publication Data
US 2010/0318848 A1  Dec. 16, 2010

(51) Int. Cl.
*G06F 11/00* (2006.01)
(52) U.S. Cl. .......................................................... 714/27
(58) Field of Classification Search ...................... 714/27
See application file for complete search history.

(56) References Cited

U.S. PATENT DOCUMENTS

| | | | |
|---|---|---|---|
| 6,732,301 B1 * | 5/2004 | Landry et al. | 714/43 |
| 6,973,592 B2 * | 12/2005 | Debling | 714/30 |
| 7,353,426 B2 * | 4/2008 | Higuchi et al. | 714/30 |
| 7,490,277 B2 * | 2/2009 | Ni | 714/727 |
| 7,836,342 B2 * | 11/2010 | Pirttimaki et al. | 714/30 |
| 2003/0120970 A1 * | 6/2003 | Chen | 714/25 |
| 2005/0197017 A1 * | 9/2005 | Chou et al. | 439/660 |
| 2008/0078669 A1 | 4/2008 | Pirttimaki et al. | |
| 2009/0150728 A1 * | 6/2009 | Barlow et al. | 714/718 |

* cited by examiner

*Primary Examiner* — Philip Guyton
(74) *Attorney, Agent, or Firm* — Alfred A. Fressola; Ware, Fressola, Van Der Sluys & Adolphson LLP

(57) ABSTRACT

This invention relates to automatically establishing a connection between a testing and/or debugging interface to an integrated circuit and a connector of an apparatus, the connector being connectable to a testing and/or debugging apparatus configured to communicate with the testing and/or debugging interface via the connector in a testing and/or debugging mode of the apparatus and connectable to an accessory apparatus to be used in a normal operation mode of the apparatus, if the testing and/or debugging apparatus is connected to the connector, thereby establishing the testing and/or debugging mode of the apparatus.

14 Claims, 8 Drawing Sheets

ESTABLISHING A CONNECTION BETWEEN A TESTING AND/OR DEBUGGING INTERFACE AND A CONNECTOR

TECHNICAL FIELD

This invention relates to establishing a connection between a testing and/or debugging interface and a connector.

BACKGROUND OF THE INVENTION

Testing and/or debugging an integrated circuit, such as for example a terminal processor, or software executed on a system comprising an integrated circuit is very difficult using only ordinary output devices, such as displays or serial interfaces, connected to the integrated circuit.

Therefore integrated circuits sometimes have dedicated testing and/or debugging interfaces. They are frequently used during the development phase of an integrated circuit or software to be executed on a system comprising an integrated circuit. When a system comprising an integrated circuit matures and is put inside its actual mechanics, these dedicated testing and/or debugging interfaces are commonly covered, thus complicating access to the testing and/or debugging interfaces. However, it is sometimes necessary to still access these dedicated testing and/or debugging interfaces, for example if some bug or fail is discovered or if the system is to be tested under authentic conditions of use.

SUMMARY OF SOME EXEMPLARY EMBODIMENTS OF THE INVENTION

According to a first aspect of the present invention, a first apparatus is disclosed. The apparatus comprises a testing and/or debugging interface to an integrated circuit;

a connector connectable to a testing and/or debugging apparatus configured to communicate with the testing and/or debugging interface via the connector in a testing and/or debugging mode of the apparatus and connectable to an accessory apparatus to be used in a normal operation mode of the apparatus;

a connection circuit controllable by a controller; and the controller, wherein the controller is configured to automatically control the connection circuit to establish a connection between the testing and/or debugging interface and the connector if the testing and/or debugging apparatus is connected to the connector, thereby establishing the testing and/or debugging mode of the apparatus.

According to the first aspect of the present invention, further a second apparatus is disclosed. The apparatus comprises means for interfacing an integrated circuit for testing and/or debugging;

first connecting means for connecting to means for communicating with the means for interfacing an integrated circuit for testing and/or debugging via the first connecting means in a testing and/or debugging mode of the apparatus and for connecting to accessory means for use in a normal operation mode of the apparatus;

second connecting means for being controllable by means for automatically controlling the second connecting means to establish a connection between the means for interfacing an integrated circuit for testing and/or debugging and the first connecting means if the means for communicating with the means for interfacing an integrated circuit for testing and/or debugging via the first connecting means in a testing and/or debugging mode of the apparatus is connected to the first connecting means, thereby establishing the testing and/or debugging mode of the apparatus; and the means for automatically controlling the second connecting means to establish a connection between the means for interfacing an integrated circuit for testing and/or debugging and the first connecting means if the means for communicating with the means for interfacing an integrated circuit for testing and/or debugging via the first connecting means in a testing and/or debugging mode of the apparatus is connected to the first connecting means, thereby establishing the testing and/or debugging mode of the apparatus.

The means for interfacing an integrated circuit for testing and/or debugging may for instance comprise a testing and/or debugging interface to an integrated circuit, but said means is not limited thereto.

The first connecting means for connecting to means for communicating with the means for interfacing an integrated circuit for testing and/or debugging via the first connecting means in a testing and/or debugging mode of the apparatus and for connecting to accessory means for use in a normal operation mode of the apparatus may for instance comprise a connector connectable to a testing and/or debugging apparatus configured to communicate with the testing and/or debugging interface via the connector in a testing and/or debugging mode of the apparatus and connectable to an accessory apparatus to be used in a normal operation mode of the apparatus, but said means is not limited thereto.

The second connecting means for being controllable by means for automatically controlling the second connecting means to establish a connection between the means for interfacing an integrated circuit for testing and/or debugging and the first connecting means if the means for communicating with the means for interfacing an integrated circuit for testing and/or debugging via the first connecting means in a testing and/or debugging mode of the apparatus is connected to the first connecting means, thereby establishing the testing and/or debugging mode of the apparatus, may for instance comprise a connection circuit controllable by a controller, wherein the controller is configured to automatically control the connection circuit to establish a connection between the testing and/or debugging interface and the connector if the testing and/or debugging apparatus is connected to the connector, thereby establishing the testing and/or debugging mode of the apparatus, but said means is not limited thereto.

The first apparatus as well as the second apparatus according to the first aspect of the present invention may be a module that forms part of or is to form part of another apparatus or it can be a separate apparatus.

In the following, for the sake of conciseness, the first aspect of the invention will be explained with respect to the first apparatus according to the first aspect. These explanations, however, apply accordingly to the second apparatus according to the first aspect of the present invention, i.e. to the means of the second apparatus corresponding to the respective element of the first apparatus.

According to a second aspect of the present invention, a first testing and/or debugging apparatus is disclosed. The testing and/or debugging apparatus is connectable to an apparatus, the apparatus comprising an integrated circuit, a testing and/or debugging interface to the integrated circuit, a connector connectable to the testing and/or debugging apparatus and connectable to an accessory apparatus to be used in a normal operation mode of the apparatus, a connection circuit controllable by a controller, wherein the controller is configured to automatically control the connection circuit to establish a connection between the testing and/or debugging interface and the connector if the testing and/or debugging apparatus is connected to the connector, thereby establishing a testing and/or debugging mode of the apparatus, and the controller. The testing and/or debugging apparatus comprises a processor configured to communicate with the testing and/or debugging interface via the connector if the apparatus is in the testing and/or debugging mode.

According to a second aspect of the present invention, a second testing and/or debugging apparatus is disclosed. The testing and/or debugging apparatus is connectable to an apparatus, the apparatus comprising an integrated circuit, means for interfacing the integrated circuit for testing and/or debugging, first connecting means for connecting to the testing and/or debugging apparatus and for connecting to accessory means for use in a normal operation mode of the apparatus, second connecting means for being controllable by means for automatically controlling the second connecting means to establish a connection between the means for interfacing an integrated circuit for testing and/or debugging and the first connecting means if the testing and/or debugging apparatus is connected to the first connecting means, thereby establishing a testing and/or debugging mode of the apparatus, and the means for automatically controlling the second connecting means to establish a connection between the means for interfacing an integrated circuit for testing and/or debugging and the first connecting means if the testing and/or debugging apparatus is connected to the first connecting means, thereby establishing the testing and/or debugging mode of the apparatus. The testing and/or debugging apparatus comprises means for communicating with the means for interfacing the integrated circuit for testing and/or debugging via the first connecting means if the apparatus is in the testing and/or debugging mode.

The means for interfacing the integrated circuit for testing and/or debugging may for instance comprise a testing and/or debugging interface to the integrated circuit, but said means is not limited thereto.

The first connecting means for connecting to the testing and/or debugging apparatus and for connecting to accessory means for use in a normal operation mode of the apparatus may for instance comprise a connector connectable to the testing and/or debugging apparatus and connectable to an accessory apparatus to be used in a normal operation mode of the apparatus, but said means is not limited thereto.

The second connecting means for being controllable by means for automatically controlling the second connecting means to establish a connection between the means for interfacing an integrated circuit for testing and/or debugging and the first connecting means if the testing and/or debugging apparatus is connected to the first connecting means, thereby establishing a testing and/or debugging mode of the apparatus, may for instance comprise a connection circuit controllable by a controller, wherein the controller is configured to automatically control the connection circuit to establish a connection between the testing and/or debugging interface and the connector if the testing and/or debugging apparatus is connected to the connector, thereby establishing a testing and/or debugging mode of the apparatus, but said means is not limited thereto.

The means for communicating with the means for interfacing the integrated circuit for testing and/or debugging via the first connecting means if the apparatus is in the testing and/or debugging mode may for instance comprise a processor configured to communicate with the testing and/or debugging interface via the connector if the apparatus is in the testing and/or debugging mode, but said means is not limited thereto.

The first apparatus as well as the second apparatus according to the second aspect of the present invention may be a module that forms part of or is to form part of another apparatus or it can be a separate apparatus.

In the following, for the sake of conciseness, the second aspect of the invention will be explained with respect to the first apparatus according to the second aspect. These explanations, however, apply accordingly to the second apparatus according to the second aspect of the present invention, i.e. to the means of the second apparatus corresponding to the respective element of the first apparatus.

According to a third aspect of the present invention, further a method is disclosed. The method comprises automatically establishing a connection between a connector of an apparatus, the apparatus comprising a testing and/or debugging interface to an integrated circuit, the connector being connectable to a testing and/or debugging apparatus configured to communicate with the testing and/or debugging interface in a testing and/or debugging mode of the apparatus and connectable to an accessory apparatus to be used in a normal operation mode of the apparatus, and the testing and/or debugging interface if the testing and/or debugging apparatus is connected to the connector, thereby establishing the testing and/or debugging mode of the apparatus.

According to a fourth aspect of the present invention, further a readable storage medium encoded with instructions that, when executed by a processor, perform the method according to the third aspect of the present invention is disclosed.

The readable storage medium may for instance be a computer-readable or processor-readable storage medium. It may be embodied as an electric, magnetic, electro-magnetic, optic or other storage medium, and may either be a removable storage medium or a storage medium that is fixedly installed in an apparatus or device.

The terms testing and/or debugging encompasses every kind of testing and/or debugging approaches. Testing and/or debugging may be understood as at least one of testing and debugging. Testing and/or debugging may involve tuning and tracing.

It is to be understood that no limitations pertain to the integrated circuit. The integrated may but does not necessarily have to form part of a system on which software can be executed, for instance a processor. To name but a few examples, the integrated circuit may comprise an application specific integrated circuit (ASIC), a digital signal processor (DSP), a field programmable gate array (FPGA) as well as other programmable and non-programmable devices.

A testing and/or debugging interface to an integrated circuit may, in exemplary embodiments of all aspects of the present invention, serve for transmitting signals to the integrated circuit and/or receiving signals from the integrated circuit. However, the testing and/or debugging interface does not have to transmit signals directly to the integrated circuit and/or receive signals directly from the integrated circuit. Intervening entities may exist. For instance, a memory configured to store information on signals exchanged between components of the integrated circuit, for example via an internal bus of the integrated circuit, may be accessible by the testing and/or debugging interface, but not directly the integrated circuit itself. However, according to all aspects of the present invention, the testing and/or debugging interface is still a testing and/or debugging interface to the integrated circuit. The testing and/or debugging interface may also serve for conveying signals either directly or indirectly to the integrated circuit. To name but one example, a signal can be transmitted to an input pin of a silicon chip comprising the integrated circuit, the pin being coupled to the integrated circuit, via the testing and/or debugging interface.

By means of the testing and/or debugging interface to the integrated circuit, execution information of a software program executed on a system comprising the integrated circuit may be obtained in some exemplary embodiments according to all aspects of the present invention. For instance, the integrated circuit may be a memory and a datum stored at a certain memory address may be read via the testing and/or debugging interface, thereby helping to debug the software program. Tracing may also be performed by constantly reading data from the memory and outputting it via the testing and/or debugging interface. Of course it may also be possible to write a datum to a certain memory address via the testing and/or debugging interface. Tracing execution information of a software program may also be performed by tapping an output pin of the integrated circuit and forwarding signals from the output pin via the testing and/or debugging interface to the other entities. A buffer, such as, for example, an Embedded Trace Buffer (ETB), may be interposed between the output pin and the testing and/or debugging interface.

The testing and/or debugging interface may for instance be implemented in hardware alone, may have certain aspects in software alone, or may be a combination of hardware and software.

The testing and/or debugging interface and the integrated circuit may be manufactured as a single module, for instance as a single chip, the testing and/or debugging interface thus being at least partially implemented as an integrated circuit, too.

In exemplary embodiments according to all aspects of the present invention, the testing and/or debugging interface is a boundary scan interface. To name but a few examples, the testing and/or debugging interface can be an instrumentation trace interface (e.g. trace output via a Mobile Industry Processor Interface (MIPI) Parallel Trace Interface (PTI)), a processor trace (e.g. ARM Ltd. Embedded Trace Macrocell (ETM) or Program Trace Macrocell (PTM) trace) interface, a Joint Test Action Group (JTAG), also known as IEEE 1149.1, interface, a compact JTAG (cJTAG), also known as IEEE 1149.7, interface, a Narrow Interface for Debug and Test (NIDnT), an ARM Ltd. Serial Wire Debug (SWD) interface or any other testing and/or debugging interface. An advantage of these embodiments may be that these interfaces are widely used and are thus readily available.

For communicating with the tracing and/or debugging interface, and possibly for storing and/or analyzing data received from the testing and/or debugging interface, a testing and/or debugging apparatus may be required. A testing and/or debugging apparatus may be thought of as an apparatus for at least one of testing and debugging. It is to be understood that communication of the testing and/or debugging apparatus and the testing and/or debugging interface does not necessarily have to be bi-directional. For instance, communication of the testing and/or debugging apparatus and the testing and/or debugging interface may involve only transmitting signals from the testing and/or debugging interface to the testing and/or debugging apparatus but not from the testing and/or debugging apparatus to the testing and/or debugging interface. To name but one exemplary testing and/or debugging apparatus, a personal computer (PC) provided with testing and/or debugging software may be seen as a testing and/or debugging apparatus.

According to exemplary embodiments of all aspects of the present invention, the testing and/or debugging apparatus is configured to communicate with the testing and/or debugging interface via the connector in a testing and/or debugging mode of the apparatus comprising the testing and/or debugging interface. In exemplary embodiments this may be understood as that the apparatus comprising the testing and/or debugging interface has to assume a mode in which communication of the testing and/or debugging interface with the testing and/or debugging apparatus is possible, while at least one other mode exists in which communication of the testing and/or debugging interface with the testing and/or debugging apparatus is not possible. Communication of the testing and/or debugging interface with the testing and/or debugging apparatus being possible does not mean that the apparatus comprising the testing and/or debugging interface being in the testing and/or debugging mode is a sufficient condition for enabling said communication. Other requirements may have to be met.

According exemplary embodiments according to all aspects of the present invention, a connection between the testing and/or debugging apparatus needs to be established so as to allow communication of the testing and/or debugging apparatus with the testing and/or debugging interface.

According to all aspects of the present invention, the apparatus comprising the testing and/or debugging interface to the integrated circuit also comprises a connector connectable to the testing and/or debugging apparatus. The connector is also connectable to an accessory apparatus to be used in a normal operation mode of the apparatus comprising the testing and/or debugging interface.

In some exemplary embodiments according to all aspects of the present invention, the normal operation mode of the apparatus comprising the testing and/or debugging interface may be considered as a mode in which, in contrast to the testing and/or debugging mode, communication of the testing and/or debugging interface with the testing and/or debugging apparatus is not possible. Except for the testing and/or debugging mode, the normal mode may be the only mode of the apparatus comprising the testing and/or debugging interface.

The accessory apparatus may be any apparatus other than a testing and/or debugging apparatus configured to communicate with the testing and/or debugging interface via the connector in a testing and/or debugging mode of the apparatus comprising the testing and/or debugging interface.

In some exemplary embodiments according to all aspects of the present invention, the accessory apparatus comprises a storage medium. The storage medium may be any type of storage medium. Merely some exemplary storage media are a Multi Media Card (MMC), a Secure Digital (SD) card, a microSD card, a Memory Stick (MS), a CompactFlash (CF) card, a Smart Media (SMD) card, a Universal Flash Storage (UFS) and an xD-Picture card. Many devices, for example portable devices such as mobile phones, personal digital assistants (PDAs), portable Global Navigation Satellite System (GNSS) devices, mobile cameras and a multitude of other devices are provided with a connector connectable to an accessory apparatus comprising a storage medium. According to the above example, the connector may then be an MMC connector, an SD card connector, an MS connector, a CF card connector, an SMD card connector or an xD-Picture Card connector, respectively. A Subscriber Identity Module (SIM) card may also be considered as an accessory apparatus comprising a storage medium. Hence, the connector may also be a SIM card connector.

However, the connector may be any connector connectable to a testing and/or debugging apparatus configured to communicate with the testing and/or debugging interface via the connector in a testing and/or debugging mode of the apparatus and connectable to an accessory apparatus to be used in a normal operation mode of the apparatus. The accessory apparatus does not have to comprise a storage medium. Thus, the connector does also not have to be one of exemplary connectors listed above. It may, to mention just some additional examples, be a Universal Serial Bus (USB) connector, a High-Definition Multimedia Interface (HDMI) connector or an audio connector such as a 2.5 mm Tip, Ring and Sleeve (TRS) or a Tip, Ring, Ring and Sleeve (TRRS) stereo connector but is also not limited thereto.

Put differently, in some exemplary embodiments of the present invention, the connector of the apparatus comprising the testing and/or debugging interface can also be employed for connecting the testing and/or debugging apparatus therewith. It is noted that the connector being connectable to both the testing and/or debugging apparatus and the accessory apparatus does not mean that the testing and/or debugging apparatus and the accessory apparatus can be connected to the connector at the same time.

According to exemplary embodiments of the first aspect and the second aspect of the present invention, the apparatus comprising the testing and/or debugging interface also comprises a connection circuit controllable by a controller. The controller is configured to automatically control the connection circuit to establish a connection between the testing and/or debugging interface and the connector if the testing and/or debugging apparatus is connected to the connector, thereby establishing the testing and/or debugging mode of the apparatus.

The controller may for instance be embodied by a processor configured to automatically control the connection circuit to establish a connection between the testing and/or debugging interface and the connector if the testing and/or debugging apparatus is connected to the connector, thereby establishing the testing and/or debugging mode of the apparatus.

Establishing a connection between the testing and/or debugging interface and the connector may be consider as a prerequisite for establishing a connection between the testing and/or debugging interface and the testing and/or debugging apparatus. Additional steps, for instance performing an initialization according to a communication protocol, may however be required in order to successfully establish a connection between the testing and/or debugging interface and the testing and/or debugging apparatus.

Automatically establishing a connection between the testing and/or debugging interface and the connector may be understood as establishing a connection between the testing and/or debugging interface and the connector without requiring the user to actively indicate to the apparatus comprising the testing and/or debugging interface that a connection between the testing and/or debugging interface and the connector shall be established other than by connecting the testing and/or debugging apparatus to the connector. This may contribute to a good user experience.

According to exemplary embodiments of all aspects of the present invention, by establishing a connection between the testing and/or debugging interface and the connector the testing and/or debugging mode of the apparatus comprising the testing and/or debugging interface is established.

By using a connector of an apparatus comprising a testing and/or debugging interface, the connector being connectable to an accessory apparatus, for also connecting a testing and/or debugging apparatus thereto, a dedicated separate testing and/or debugging apparatus connector of the apparatus comprising the testing and/or debugging interface may not be necessary, thus saving manufacturing cost, while at the same time enabling uncomplicated access of the testing and/or debugging apparatus to the testing and/or debugging interface if a connection between the testing and/or debugging interface and the connector is established. Additional degrees of freedom with respect to the design of an apparatus the testing and/or debugging interface forms part of may become available if a dedicated separate testing and/or debugging apparatus connector does not have to be provided.

In exemplary embodiments according to the first aspect of the present invention, the controller is configured to automatically control the connection circuit to establish a connection between the testing and/or debugging interface and the connector based on an identifier received from the testing and/or debugging apparatus via the connector if the testing and/or debugging apparatus is connected to the connector, the identifier identifying the testing and/or debugging apparatus as a testing and/or debugging apparatus.

In exemplary embodiments according to the second aspect of the present invention, the testing and/or debugging apparatus comprises a processor configured to transmit an identifier to the controller of the apparatus via the connector, the identifier identifying the testing and/or debugging apparatus as a testing and/or debugging apparatus.

In exemplary embodiments according to the third aspect and the fourth aspect of the present invention, establishing a connection between the testing and/or debugging interface and the connector is based on an identifier received by the apparatus from the testing and/or debugging apparatus via the connector if the testing and/or debugging apparatus is connected to the connector, the identifier identifying the testing and/or debugging apparatus as a testing and/or debugging apparatus.

An advantage of these exemplary embodiments can be that the identifier can serve for determining whether the accessory apparatus or the testing and/or debugging apparatus is connected to the connector. Having determined that the testing and/or debugging apparatus is connected to the connector, a connection between the testing and/or debugging interface and the connector may be established.

In exemplary embodiments according to the first aspect of the present invention, the controller is configured to automatically execute an initialization protocol, the initialization protocol being configured to initialize the accessory apparatus independently of whether the accessory apparatus or the testing and/or debugging apparatus is connected to the connector.

In exemplary embodiments according to the second aspect of the present invention, the processor configured to transmit an identifier to the controller of the apparatus via the connector is further configured to respond to requests issued by the controller according to an initialization protocol automatically executed by the controller, the initialization protocol being configured to initialize the accessory apparatus independently of whether the accessory apparatus or the testing and/or debugging apparatus is connected to the connector, in a manner allowing the controller to assume a state in which it is configured to receive and process the identifier.

In exemplary embodiments according to the third aspect and the fourth aspect of the present invention, the method comprises or the instructions perform automatically executing an initialization protocol on the part of the apparatus, the initialization protocol being configured to initialize the accessory apparatus independently of whether the accessory apparatus or the testing and/or debugging apparatus is connected to the connector, and responding of the testing and/or debugging apparatus to requests issued by the apparatus according to the initialization protocol in a manner allowing the apparatus to assume a state in which it is configured to receive and process the identifier.

An advantage of these exemplary embodiments may be that if any of the testing and/or debugging apparatus and the accessory apparatus has been connected to the connector, an initialization protocol, the initialization protocol being configured to initialize the accessory apparatus, may be executed. If the accessory apparatus has been connected to the connector, execution of the initialization protocol may yield initialization of the accessory apparatus without the need for further actions by a user who has connected the accessory apparatus to the connector. This may contribute to a good user experience. Yet, even if the testing and/or debugging apparatus has been connected to the connector, the initialization protocol configured to initialize the accessory apparatus is automatically executed. Therefore, it is initially not necessary for the apparatus to distinguish between a scenario in which the accessory apparatus has been connected to the connector and a scenario in which the testing and/or debugging apparatus has been connected to the connector. With a distinguishing step not being necessary, having been connected to the connector, the accessory apparatus may be initialized quickly.

Furthermore, the possibility of automatically establishing a connection between the testing and/or debugging interface and the connector if a testing and/or debugging apparatus has been connected to the connector may thus not affect how the apparatus comprising the testing and/or debugging interface behaves upon connecting the accessory apparatus. Modifications of the initialization protocol configured to initialize the accessory apparatus may be unnecessary.

The testing and/or debugging apparatus may respond to requests issued by the apparatus according to the initialization protocol in a manner allowing the apparatus to assume a state in which it is configured to receive and process the identifier. For instance, the testing and/or debugging apparatus may respond to these requests as the accessory apparatus would have to respond in order to induce successful initialization.

Initialization of the accessory apparatus according to the initialization protocol may involve that the accessory apparatus has to transmit an identifier to the apparatus comprising the testing and/or debugging interface, alternatively an identifier may have to be sent to the apparatus comprising the testing and/or debugging interface in an identification phase following initialization of the accessory apparatus. In both cases, the apparatus comprising the testing and/or debugging interface may expect the accessory apparatus to transmit an identifier and may thus be in a state in which it is configured to receive and process the identifier.

Yet, if the testing and/or debugging apparatus has been connected to the connector, the identifier transmitted from the testing and/or debugging apparatus may be an identifier that is generally not assigned to accessory apparatuses. It may then be deduced from the identifier that the apparatus connected to the connector is not the accessory apparatus but the testing and/or debugging apparatus.

If the identifier is transmitted in response to an initialization protocol request, execution of the initialization protocol may be terminated if the identifier has been received on part of the apparatus.

A connection between the testing and/or debugging interface may be automatically established as a result of receiving and processing the identifier.

In exemplary embodiments according to the first aspect and the second aspect of the present invention, the controller is configured to control the connection circuit to release the connection between the testing and/or debugging interface and the connector if the testing and/or debugging apparatus is disconnected from the connector, thereby terminating the testing and/or debugging mode of the apparatus.

In exemplary embodiments according to the third aspect and the fourth aspect of the present invention, the method comprises or the instructions perform releasing the connection between the testing and/or debugging interface and the connector if the testing and/or debugging apparatus is disconnected from the connector, thereby terminating the testing and/or debugging mode of the apparatus.

According to some of these exemplary embodiments, disconnecting the testing and/or debugging apparatus from the connector causes release of the connection between the testing and/or debugging interface and the connector and termination of the testing and/or debugging mode of the apparatus comprising the testing and/or debugging interface. If the accessory apparatus is connected to the connector after termination of the testing and/or debugging mode, initializing the accessory apparatus and communicating with the accessory apparatus may for example be performed in the same manner as if the testing and/or debugging apparatus had not been connected to the connector before and the testing and/or debugging mode had not been established. In other words, disconnecting the testing and/or debugging apparatus from the connector may cause the apparatus to reassume the state it had been in before connecting the testing and/or debugging apparatus. In case of only a testing and/or debugging mode and a normal mode of the apparatus being provided, release of the connection between the testing and/or debugging interface and the connector and termination of the testing and/or debugging mode of the apparatus may automatically yield the apparatus to reassume the normal mode.

In exemplary embodiments according to the first aspect of the present invention, the apparatus comprises at least a first testing and/or debugging interface and a second testing and/or debugging interface to at least one integrated circuit. The apparatus further comprises at least one of:

a selector interposed between the first testing and/or debugging interface and the second testing and/or debugging interface on the one side and the connection circuit on the other side, the selector being configured to select one of a signal received from the first testing and/or debugging interface and a signal received from the second testing and/or debugging interface and to output the selected signal; and a combiner interposed between the first testing and/or debugging interface and the second testing and/or debugging interface on the one side and the connection circuit on the other side, the combiner being configured to combine a signal received from the first testing and/or debugging interface and a signal received from the second testing and/or debugging interface and to output the combined signal.

In exemplary embodiments according to the second aspect of the present invention, the apparatus comprises at least a first testing and/or debugging interface and a second testing and/or debugging interface to at least one integrated circuit. The testing and/or debugging apparatus further comprises a decomposer configured to decompose a combined signal received from the apparatus via the connector, the combined signal comprising a signal from the first testing and/or debugging interface and a signal from the second testing and/or debugging interface, into the signal from the first testing and/or debugging interface and the signal from the second testing and/or debugging interface.

In exemplary embodiments according to the third aspect and the fourth aspect of the present invention, the apparatus comprises at least a first testing and/or debugging interface and a second testing and/or debugging interface to at least one integrated circuit. The method comprises or the instructions perform at least one of:

selecting one of a signal from the first testing and/or debugging interface and a signal from the second testing and/or debugging interface and outputting the selected signal to the connector; and combining a signal from the first testing and/or debugging interface and a signal from the second testing and/or debugging interface and outputting the combined signal to the connector.

More than one testing and/or debugging interface may be required if different testing and/or debugging technologies are to be applied as well as if more than one integrated circuit is to be tested and/or debugged. To name but one example, three testing and/or debugging interfaces to an integrated circuit may be required. For instance, the first testing and/or debugging interface may be a processor trace interface (e.g. an ETM interface), the second testing and/or debugging interface may be an instrumentation trace interface (e.g. a System Trace Module (STM) interface) and the third testing and/or debugging interface may be a basic debug link (e.g. compact JTAG interface).

According to some exemplary embodiments of the present invention, all of the more than one testing and/or debugging interfaces may transmit signals. One of these signals can be selected and forwarded to the connector, while the other signals are not output to the connector. Alternatively, at least two of the signals can be combined, thus forming a combined signal. The combined signal may then be output to the connector via a single bus and possibly forwarded to the testing and/or debugging apparatus via the connector. This may allow efficiently providing at least two signals from different testing and/or debugging interfaces to the testing and/or debugging apparatus.

For further processing of the combined signal, the combined signal may then be decomposed into the at least two signals from different testing and/or debugging interfaces on the testing and/or debugging apparatus side.

In exemplary embodiments according to the first aspect of the present invention, the apparatus comprises a decomposer interposed between the first testing and/or debugging interface and the second testing and/or debugging interface on the one side and the connection circuit on the other side, the decomposer configured to decompose a combined signal received from the testing and/or debugging apparatus via the connector, the combined signal comprising a signal addressed to the first testing and/or debugging interface and a signal addressed to the second testing and/or debugging interface, into the signal addressed to the first testing and/or debugging interface and the signal addressed to the second testing and/or debugging interface.

In exemplary embodiments according to the second aspect of the present invention, the testing and/or debugging apparatus comprises a combiner, the combiner being configured to combine a signal addressed to the first testing and/or debugging interface and a signal addressed to the second testing and/or debugging interface and to output the combined signal.

In exemplary embodiments according to the third aspect and the fourth aspect of the present invention, the apparatus comprises at least a first testing and/or debugging interface and a second testing and/or debugging interface to at least one integrated circuit. The method comprises or the instructions perform decomposing a combined signal received from the testing and/or debugging apparatus via the connector, the combined signal comprising a signal addressed to the first testing and/or debugging interface and a signal addressed to the second testing and/or debugging interface, into the signal addressed to the first testing and/or debugging interface and the signal addressed to the second testing and/or debugging interface.

According to some of theses exemplary embodiments of the present invention, the testing and/or debugging apparatus can generate a combined signal comprising a signal addressed to the first testing and/or debugging interface and a signal addressed to the second testing and/or debugging interface and to output the combined signal. The combined signal may be decomposed on part of the apparatus comprising the first testing and/or debugging interface and the second testing and/or debugging interface. This may allow, for instance, efficiently providing at least two signals from the testing and/or debugging apparatus to different testing and/or debugging interfaces on a single bus.

In exemplary embodiments according to the first aspect of the present invention, the connection circuit comprises at least one of:
  a selector, the selector being configured to select in the testing and/or debugging mode from
    a signal received from the testing and/or debugging interface
    and a signal received from an entity configured to communicate with the accessory apparatus in the normal mode of the apparatus if the accessory apparatus is connected to the connector
    the signal received from the testing and/or debugging interface and to output the selected signal; and
  a combiner, the combiner being configured to combine in the testing and/or debugging mode
    a signal received from the testing and/or debugging interface and
    a signal received from an entity configured to communicate with the accessory apparatus in the normal mode of the apparatus if the accessory apparatus is connected to the connector
    and to output the combined signal.

In exemplary embodiments according to the second aspect of the present invention, the testing and/or debugging apparatus comprises a decomposer configured to decompose a combined signal received from the apparatus via the connector, the combined signal comprising a signal from the testing and/or debugging interface and a signal from an entity configured to communicate with the accessory apparatus in the normal mode of the apparatus if the accessory apparatus is connected to the connector, into the signal from the testing and/or debugging interface and the signal from an entity configured to communicate with the accessory apparatus in the normal mode of the apparatus if the accessory apparatus is connected to the connector.

In exemplary embodiments according to the third aspect and the fourth aspect of the present invention, the apparatus comprises at least a first testing and/or debugging interface and a second testing and/or debugging interface to at least one integrated circuit. The method comprises or the instructions perform at least one of:
  selecting in the testing and/or debugging mode of the apparatus from
    a signal from the testing and/or debugging interface and
    a signal from an entity configured to communicate with the accessory apparatus in the normal mode of the apparatus if the accessory apparatus is connected to the connector
    the signal from the testing and/or debugging interface and outputting the selected signal to the connector; and combining in the testing and/or debugging mode of the apparatus
    a signal from the testing and/or debugging interface and
    a signal from an entity configured to communicate with the accessory apparatus in the normal mode of the apparatus if the accessory apparatus is connected to the connector
    and outputting the combined signal to the connector.

For instance, an entity configured to communicate with the accessory apparatus in the normal mode of the apparatus if the accessory apparatus is connected to the connector can be any entity configured to transmit signals to the accessory apparatus via the connector in the normal mode and/or receive signals from the accessory apparatus via the connector in the normal mode. To name but one example, such an entity may be a camera and the accessory apparatus may comprises a storage medium. Image information acquired by means of the camera may be forwarded to the storage medium of the accessory apparatus for storage. In another exemplary scenario, the accessory apparatus may also comprises a storage medium but the entity is a controller for the storage medium. The controller may also serve for controlling purposes with regard to a connection to the testing and/or debugging apparatus.

The entity may form part of the apparatus comprising the testing and/or debugging interface or it may be arranged outside of both the testing and/or debugging apparatus and the apparatus comprising the testing and/or debugging interface.

On the one hand, by selecting in the testing and/or debugging mode of the apparatus from a signal from the testing and/or debugging interface and a signal from an entity configured to communicate with the accessory apparatus in the normal mode of the apparatus if the accessory apparatus is connected to the connector the signal from the testing and/or debugging interface and outputting the selected signal to the connector, providing the testing and/or debugging apparatus with signals from the testing and/or debugging interface may be enabled.

On the other hand, combining in the testing and/or debugging mode of the apparatus a signal received from the testing and/or debugging interface and a signal from an entity configured to communicate with the accessory apparatus in the normal mode of the apparatus if the accessory apparatus is connected to the connector and outputting the combined signal to the connector may allow the testing and/or debugging apparatus to analyze both the signal from the testing and/or debugging interface and the signal from the entity configured to communicate with the accessory apparatus in the normal mode of the apparatus if the accessory apparatus is connected to the connector. To this end, the testing and/or debugging apparatus may need to decompose the combined signal. If the integrated circuit is configured to interact with the accessory apparatus in the normal mode of the apparatus if the accessory apparatus is connected to the connector, the testing and/or debugging apparatus may also test and/or debug this interaction.

In exemplary embodiments according to the first aspect of the present invention, the controller is configured to control the selector to map pins of the testing and/or debugging interface to pins of the connector according to a predefined mapping scheme.

In exemplary embodiments according to the third aspect and the fourth aspect of the present invention, the method comprises or the instructions perform selecting in the testing and/or debugging mode of the apparatus from a signal from the testing and/or debugging interface and a signal from an entity configured to communicate with the accessory apparatus in the normal mode of the apparatus if the accessory apparatus is connected to the connector the signal from the testing and/or debugging interface and outputting the selected signal to the connector involves mapping pins of the testing and/or debugging interface to pins of the connector according to a predefined mapping scheme.

Some of these exemplary embodiments of the present invention may allow for providing different pin overlay modes which vary in the selected predefined mapping scheme. Mapping may also yield selection of at least one signal from at least one testing and/or debugging interface forming part of a combined signal comprising more than one signal from more than one testing and/or debugging interface.

In exemplary embodiments according to the first aspect of the present invention, the connection circuit comprises a decomposer, the decomposer configured to decompose a combined signal received from the testing and/or debugging apparatus via the connector, the combined signal comprising a signal addressed to the testing and/or debugging interface and a signal addressed to an entity configured to communicate with the accessory apparatus in the normal mode of the apparatus if the accessory apparatus is connected to the connector, into the signal addressed to the testing and/or debugging interface and the signal addressed to the entity configured to communicate with the accessory apparatus in the normal mode of the apparatus if the accessory apparatus is connected to the connector.

In exemplary embodiments according to the second aspect of the present invention, the testing and/or debugging apparatus comprises a combiner, the combiner being configured to combine a signal addressed to the testing and/or debugging interface and a signal addressed to the entity configured to communicate with the accessory apparatus in the normal mode of the apparatus if the accessory apparatus is connected to the connector and to output the combined signal.

In exemplary embodiments according to the third aspect and the fourth aspect of the present invention, the method comprises or the instructions perform decomposing a combined signal received from the testing and/or debugging apparatus via the connector, the combined signal comprising a signal addressed to the testing and/or debugging interface and a signal addressed to an entity configured to communicate with the accessory apparatus in the normal mode of the apparatus if the accessory apparatus is connected to the connector, into the signal addressed to the testing and/or debugging interface and the signal addressed to the entity configured to communicate with the accessory apparatus in the normal mode of the apparatus if the accessory apparatus is connected to the connector.

According to some of theses exemplary embodiments of the present invention, the testing and/or debugging apparatus can generate a combined signal comprising a signal addressed to the testing and/or debugging interface and a signal addressed to the entity configured to communicate with the accessory apparatus in the normal mode of the apparatus if the accessory apparatus is connected to the connector. The combined signal may be decomposed on part of the apparatus comprising the testing and/or debugging interface. Thereby, the testing and/or debugging interface or the entity configured to communicate with the accessory apparatus in the normal mode of the apparatus if the accessory apparatus is connected to the connector may be provided with the signals based on the signal address.

For instance, this may enable the testing and/or debugging apparatus to transmit signals to the testing and/or debugging interface and to the entity configured to communicate with the accessory apparatus in the normal mode of the apparatus if the accessory apparatus is connected to the connector. Thus, in testing and/or debugging the integrated circuit by means of the testing and/or debugging interface interactions between the integrated circuit and the entity configured to communicate with the accessory apparatus in the normal mode of the apparatus if the accessory apparatus is connected to the connector, the interactions being influenced by the signals transmitted to the entity configured to communicate with the accessory apparatus in the normal mode of the apparatus if the accessory apparatus is connected to the connector, may be analyzed.

In exemplary embodiments according to the first aspect of the present invention, the apparatus is configured to enable access to the testing and/or debugging interface only if the apparatus has received a valid security certificate from the testing and/or debugging apparatus.

In exemplary embodiments according to the second aspect of the present invention, the testing and/or debugging apparatus comprises a processor configured to cause a security certificate to be transmitted to the apparatus comprising the testing and/or debugging interface.

To a cause a security certificate to be transmitted to the testing and or debugging apparatus, the processor configured to cause a security certificate to be transmitted to the apparatus comprising the testing and/or debugging interface may be operationally coupled to a security certificate transmitter configured to transmit a security certificate to the apparatus. No limitations pertain to the underlying technology the security certificate transmitter is configured to use for transmitting the security certificate to the apparatus. The security certificate transmitter may form part of the testing and/or debugging apparatus or even form part of the processor configured to cause a security certificate to be transmitted to the apparatus comprising the testing and/or debugging interface. It may however also be an external apparatus or module.

In exemplary embodiments according to the third aspect and the fourth aspect of the present invention, the method comprises or the instructions perform enabling access to the testing and/or debugging interface only if the apparatus has received a valid security certificate from the testing and/or debugging apparatus.

Enabling access to the testing and/or debugging interface only if the apparatus has received a valid security certificate from the testing and/or debugging apparatus may be implemented in a variety of different ways. For example, a processor configured to enable access to the testing and/or debugging interface only if the apparatus has received a valid security certificate from the testing and/or debugging apparatus can be provided. The processor can, for instance, be directly coupled to connector, can be interposed between the connection circuit and the testing and/or debugging interface or it can form part of the controller. Furthermore, the apparatus comprising the testing and/or debugging interface does not yet have to be in the testing and/or debugging mode to be able to receive the security certificate.

For example, a processor configured to enable access to the testing and/or debugging interface only if the apparatus has received a valid security certificate from the testing and/or debugging apparatus may form part of the controller, which in turn may be directly coupled to the connector. Receipt of the security certificate may then be a precondition for the controller to control the connection circuit to establish a connection between the testing and/or debugging interface and the connector, thereby establishing the testing and/or debugging mode of the apparatus.

It may also be possible to establish a connection between the testing and/or debugging interface but to still not enable access to the testing and/or debugging interface unless a valid security certificate has been received. To this end, for instance, the connection circuit may comprise a security circuit that is configured to forward signals from the testing and/or debugging apparatus to the testing and/or debugging interface only if a valid security certificate has been received.

In some of these exemplary embodiments of the present invention, the necessity of receiving a valid security certificate before access to the testing and/or debugging interface is enabled may serve for preventing an unauthorized person from tampering with the integrated circuit by means of the testing and/or debugging interface. For instance, it may be desired to not grant an end-user access to the testing and/or debugging interface.

The features of the present invention and of its exemplary embodiments as presented above shall also be understood to be disclosed in all possible combinations with each other.

It is to be noted that the above description of embodiments of the present invention is to be understood to be merely exemplary and non-limiting.

Further aspects of the invention will be apparent from and elucidated with reference to the detailed description presented hereinafter.

DETAILED DESCRIPTION OF EXEMPLARY EMBODIMENTS OF THE PRESENT INVENTION

In the following detailed description of the present invention, exemplary embodiments of the present invention will be described in the context of accessory apparatuses comprising a storage medium. It is however emphasized that other accessory apparatuses and connectors may as well be employed according to the present invention.

Figure 1:
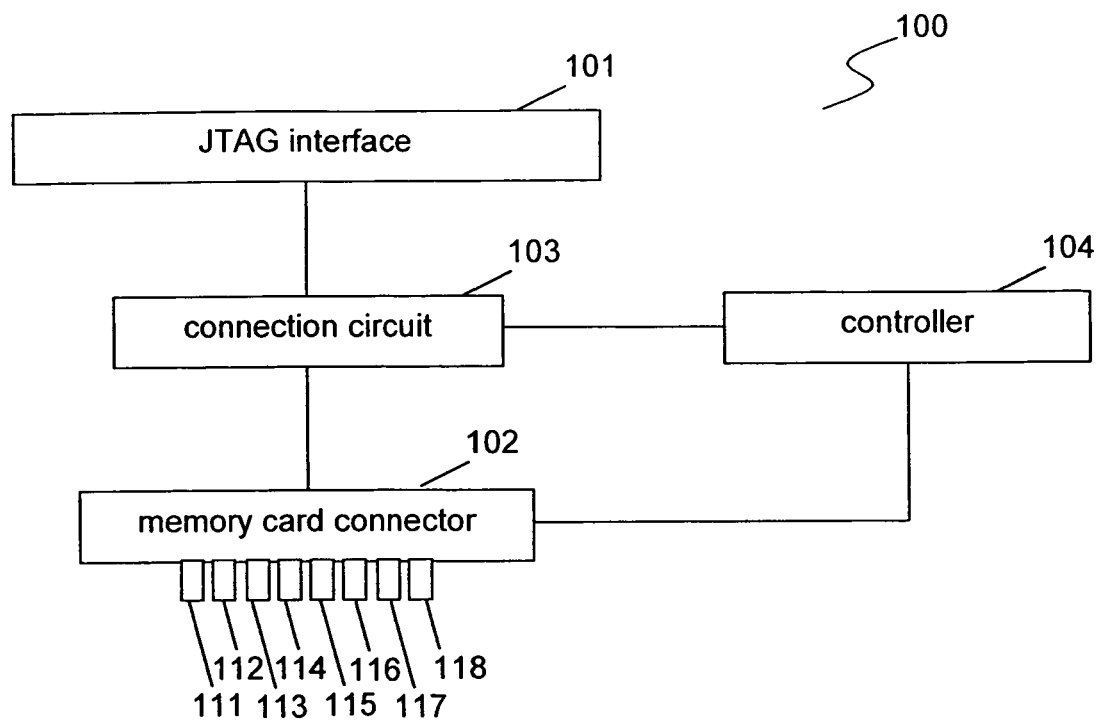
FIG. 1: An exemplary illustration of a first embodiment of an apparatus according to the first aspect of the present invention.

FIG. 1 shows an exemplary illustration of a first embodiment of an apparatus 100 according to the first aspect of the present invention.

The apparatus comprises a JTAG interface 101, a memory card connector 102, a connection circuit 103 and a controller 104.

The JTAG interface 101 of the apparatus 100 is a testing and/or debugging interface to an integrated circuit.

In the present example, the memory card connector 102 is connectable to a microSD card, which is an accessory apparatus to be used in a normal operation mode of the apparatus 100. The memory card connector 102 is thus a mircoSD card connector. It has eight pins 111-118.

For instance, the apparatus 100 may form part of a digital audio player. In a normal operation mode, the apparatus 100 accesses a microSD card to provide other components of the digital audio player with music stored on the microSD card in a digital format. The memory card connector 102 is also connectable to a testing and/or debugging apparatus configured to communicate with the JTAG interface 101 via the memory card connector 102 in a testing and/or debugging mode of the apparatus 100.

The connection circuit 103 of the apparatus 100 is controllable by the controller 104. The controller 104 is configured to automatically control the connection circuit 103 to establish a connection between the JTAG interface 101 and the memory card connector 102 if the testing and/or debugging apparatus is connected to the memory card connector 102, thereby establishing the testing and/or debugging mode of the apparatus 100.

The controller 104 is operatively coupled to the connection circuit 103 so as to enable the controller 104 to control the connection circuit 103. For allowing the controller to detect if the testing and/or debugging apparatus is connected to the memory card connector 102, an operative coupling between the controller 104 and the memory card connector 102 is also provided.

By means of the JTAG interface 101 to an integrated circuit, execution information of a software program executed on a system comprising the integrated circuit may be obtained. The execution information may be received by a testing and/or debugging apparatus from the JTAG interface 101. The testing and/or debugging apparatus is thus configured to communicate with the testing and/or debugging interface 101 via the memory card connector 102 in a testing and/or debugging mode of the apparatus 100. Having received the execution information, the testing and/or debugging apparatus may analyze the execution information or merely present the execution information to a user.

As a precondition for enabling communication of the testing and/or debugging apparatus with the JTAG interface 101, a connection between the testing and/or debugging apparatus and the JTAG interface 101 needs to be established. To this end, a connection between the JTAG interface 101 and the memory card connector 102 is required. The controller 104 is configured to automatically control the connection circuit 103, which may for instance comprise a relay, to establish a connection between the JTAG interface 101 and the memory card connector 102 if a testing and/or debugging apparatus is connected to the memory card connector 102. Thereby, a testing and/or debugging mode of the apparatus 100 is established.

Additional steps, for instance performing an initialization according to a communication protocol, may however be required in order to successfully establish a connection between the JTAG interface 101 and the testing and/or debugging apparatus. Thus, the apparatus 100 assuming the testing and/or debugging mode may be a necessary but not sufficient condition for enabling communication of the JTAG interface 101 and a testing and/or debugging apparatus.

According to the embodiment of the present invention currently explained, in another mode, for instance a normal mode in which a microSD card connected to the memory card connector 102 is used, no connection between the JTAG interface 101 and the memory card connector 102 is provided.

The controller 104 automatically controls the connection circuit 103 to establish a connection between the JTAG interface 101 and the memory card connector 102 if a testing and/or debugging apparatus is connected to the memory card connector 102. For example, in case of the connection circuit 103 comprising a relay, the controller 104 can automatically apply a suitable voltage to the relay which in consequence establishes a connection between the JTAG interface 101 and the memory card connector 102 by forming a closed electrical path.

According to the embodiment currently discussed, establishing a connection between the JTAG interface 101 and the memory card connector 102 does thus not require the user to actively indicate to the apparatus 100 that a connection between the JTAG interface 101 and the memory card connector 102 shall be established other than by connecting a testing and/or debugging apparatus to the memory card connector 102. This may contribute to a good user experience.

By using the memory card connector 102 of the apparatus 100 for connecting a testing and/or debugging apparatus to the JTAG interface 101, a dedicated separate testing and/or debugging apparatus connector of the apparatus 100 may not be necessary, thus saving manufacturing cost, while at the same time enabling uncomplicated access of the testing and/or debugging apparatus to the JTAG interface 101. Additional degrees of freedom with respect to the design of an apparatus the apparatus 100 forms part of may become available if a dedicated separate testing and/or debugging apparatus connector does not have to be provided.

Figure 2:
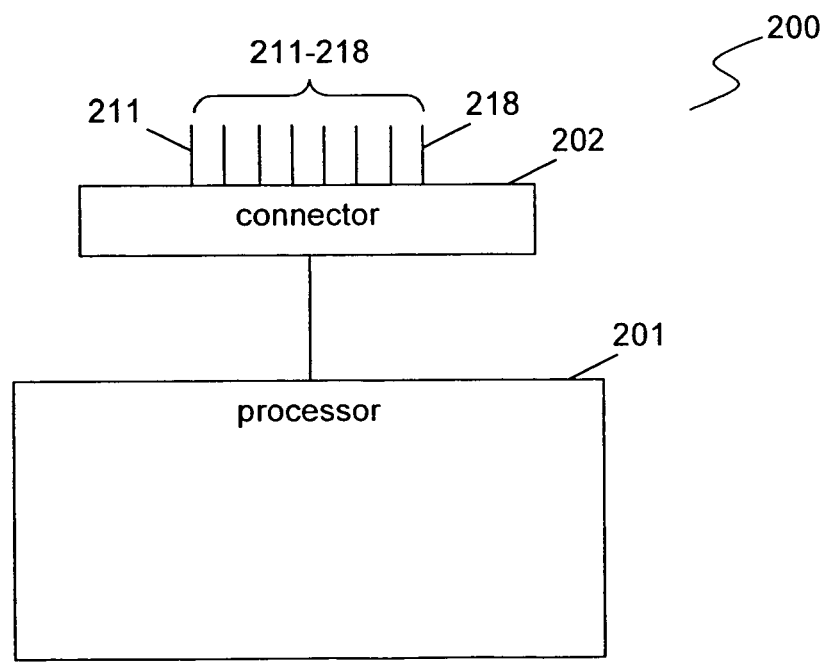
FIG. 2: An exemplary illustration of a first embodiment of a testing and/or debugging apparatus according to the second aspect of the present invention which is connectable to the apparatus of FIG. 1.

FIG. 2 shows an exemplary illustration of a first embodiment of a testing and/or debugging apparatus 200 according to the second aspect of the present invention which is connectable to the apparatus of FIG. 1.

The testing and/or debugging apparatus 200 comprises a processor 201 and a connector 202 which has eight pins 211-218.

By means of the connector 202, the testing and/or debugging apparatus 200 is connectable to apparatus 100 of FIG. 1. To this end, the shape of the connector 202 resembles the shape of a microSD card. By connecting the connector 202 of the testing and/or debugging apparatus 200 to the memory card connector 102 of the apparatus 100, an electrical contact of the pins 111-118 and the respective pins 211-218 of the testing and/or debugging apparatus 200 is made.

The processor 201 is configured to communicate with the JTAG interface 101 of the apparatus 100 via the connector 102 if the apparatus 100 is in the testing and/or debugging mode.

Figure 3:
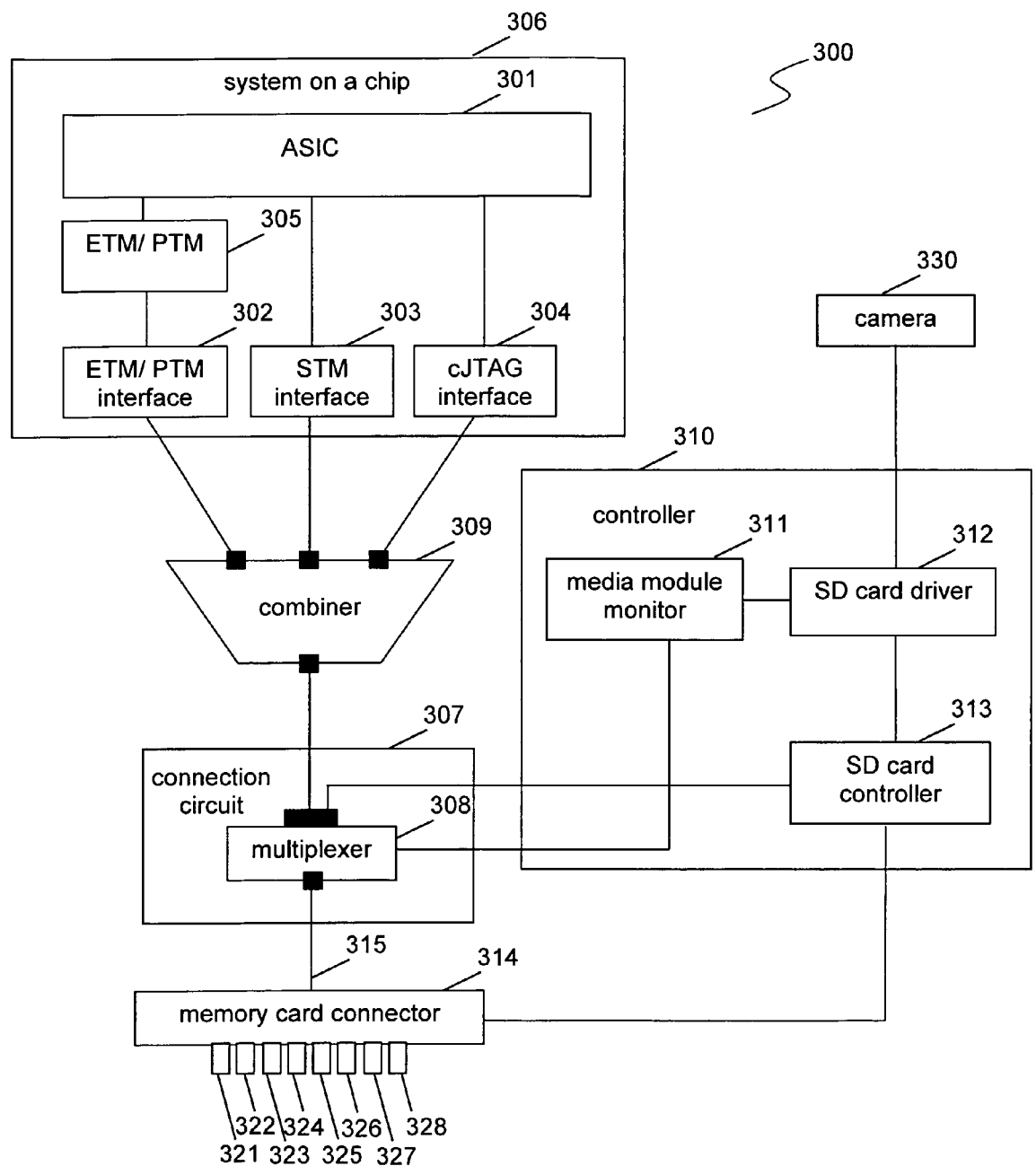
FIG. 3: An exemplary illustration of a second embodiment of an apparatus according to the first aspect of the present invention.

FIG. 3 shows an exemplary illustration of a second embodiment of an apparatus 300 according to the first aspect of the present invention.

The apparatus 300 comprises an ASIC 301, an ETM/PTM processor trace interface 302, an STM instrumentation trace interface 303, a debug cJTAG interface 304 and an ETM/PTM 305. The ASIC 301, the interfaces 302-304 and the ETM/PTM 305 form part of a system on a chip (SoC) 306. Furthermore, the apparatus 300 comprises a connection circuit 307 which encompasses a multiplexer 308. Interposed between the testing and/or debugging interfaces 302-304 and the connection circuit 307 is a combiner 309. A controller 310 is also provided. It comprises a media module monitor 311, an SD card driver 312 and an SD card controller 313. Moreover, the apparatus 300 comprise a memory card connector 314 having eight pins 321-328 and being connected to the connection circuit by means of an memory card bus 315. The apparatus 300 also comprises a camera module 330.

In the present example, the memory card connector 314 is connectable to a mircoSD card, which is an accessory apparatus to be used in a normal operation mode of the apparatus 300. The memory card connector 314 is thus a mircoSD card connector. It has eight pins 321-328. In the normal operation mode of the apparatus 300 the camera module 330 can access a mircoSD card connected to the connector 314 to store image data thereon. The camera module is thus an entity configured to communicate with a mircoSD card in the normal mode of the apparatus 300 if the mircoSDcard is connected to the memory card connector 314. Being entities arranged on the path from the camera module 330 to the memory card connector 314, the SD card driver 312 and the SD card controller may also be considered as entities configured to communicate with a mircoSD card in the normal mode of the apparatus 300 if the mircoSD card is connected to the memory card connector 314.

The memory card connector 314 is also connectable to a testing and/or debugging apparatus configured to communicate with the testing and/or debugging interfaces 302-304 via the memory card connector 314 in a testing and/or debugging mode of the apparatus 300.

The testing and/or debugging interfaces 302-304 and the ASIC 301 are manufactured as a single module. The ETM/PTM interface 302 does not interface the ASIC 301 directly but via the ETM/PTM 305. The STM interface 303 may be any interface to an STM (not shown), for example a PTI. By providing three testing and/or debugging interfaces 302-304, different testing and/or debugging technologies can be applied to test and/or debug the ASIC 301.

Interposed between the testing and/or debugging interfaces 302-304 and the connection circuit 307 is the combiner 309. It is configured to combine a signal received from the ETM/PTM interface 302, a signal received from the STM interface 303 and a signal received from the cJTAG interface 304 and to output the combined signal to the connection circuit 307 on a single bus. The combiner 309 is configured to perform combination of the signals received from the testing and/or debugging interfaces 302-304 by means of funnelling.

The connection circuit 307 is controllable by the controller 310.

The controller 310 is configured to automatically control the connection circuit 307 to establish a connection between the testing and/or debugging interfaces 302-304 and the memory card connector 314 based on an identifier received from a testing and/or debugging apparatus via the memory card connector 314 if the testing and/or debugging apparatus is connected to the memory card connector 314, the identifier identifying the testing and/or debugging apparatus as a testing and/or debugging apparatus, thereby establishing the testing and/or debugging mode of the apparatus 300.

The controller 310 is configured to automatically execute an initialization protocol, the initialization protocol being configured to initialize a microSD card independently of whether a microSD card or a testing and/or debugging apparatus is connected to the memory card connector 314.

The SD card driver 312 and the SD card controller 313 of the controller 310 are configured to request the apparatus connected to the memory card connector 314 to respond or act to GO_IDLE (CMD0), SEND_IF_COND (CMD8) and SD_SEND_OP_COND (ACMD41).

In another exemplary embodiment of the present invention in which the memory card connector 314 is not a microSD card connector but an MMC card connector, instead of the SD card driver 312 and the SD card controller 313 an MMC card driver and an MMC card controller may be provided. To initialize an MMC card connected to the memory card connector 314, the MMC card driver and the MMC card controller would then be configured to request the connected device, i.e. an MMC card or a testing and/or debugging apparatus, to send its valid operation conditions (CMD1) after activation of the memory card bus 315. The response to CMD1 is the 'wired and' operation on the condition restrictions of all devices connected to the memory card bus 315.

In the exemplary embodiment of the present invention currently discussed, however, if the testing and/or debugging apparatus is connected to the memory card connector 314 and if the testing and/or debugging apparatus responds to the requests issued by the SD card driver 312 as a microSD card would respond to them, the SD card driver 312 and the SD card controller 313 are configured to issue the broadcast command ALL_SEND_CID (CMD2), asking all devices connected to the memory card bus 315 for their unique card identification (CID) number.

If a testing and/or debugging apparatus is connected to the memory card bus 315, in the embodiment of the present invention currently discussed, he testing and/or debugging apparatus may transmit a unique CID to identify itself as a testing and/or debugging apparatus. The identifier may be an identifier that is generally not assigned to microSD cards. The controller 310, namely the SD card driver 312 and the SD card controller 313 thereof, is configured to deduce from the identifier that the apparatus connected to the connector is not a microSD card but a testing and/or debugging apparatus.

By responding the requests CMD0, CMD8 and ACMD41 issued by the SD card driver 312 according to the initialization protocol as a microSD card would respond to them, the testing and/or debugging apparatus allows the SD card driver 312 and the SD card controller 313, and thus the controller 310, to issue the CMD2. Awaiting a response to the CMD2, the controller 310 has assumed a state in which it is configured to receive and process the identifier transmitted from the testing and/or debugging apparatus in response to the CMD2.

The SD card driver 312 of the controller 310 is configured to process the identifier and to thus notice that a testing and/or debugging apparatus has been connected to the memory card connector 314. Furthermore, the SD card driver 312 is configured to subsequently notify the media module monitor 311 that a testing and/or debugging apparatus has been connected to the memory card connector 314. It is also configured to notify the camera module 330 that access to a microSD card connected to the memory card connector 314 is currently not provided. The testing and/or debugging apparatus connected to the memory card connector 314 is considered to be an invalid microSD card.

The media module monitor 311 is configured to, upon being notified that a testing and/or debugging apparatus has been connected to the memory card connector 314, control the multiplexer 308 of the connection circuit 307 to map pins of the testing and/or debugging interfaces 302-304 to the pins 321-328 of the memory card connector 314 according to a predefined mapping scheme. Thus, mapping pins of the testing and/or debugging interfaces 302-304 to the pins 321-328 of the memory card connector 314 may, according to the present example, be considered as establishing a connection between the pins of the testing and/or debugging interfaces 302-304 that are mapped to the pins 321-328 of the memory card connector 314 and the pins 321-328 of the memory card connector 314, thereby establishing the testing and/or debugging mode of the apparatus 300.

By not mapping pins of the SD card controller 313 to the pins 321-328 of the memory card connector 314, the multiplexer serves as a selector configured to select in the testing and/or debugging mode from, on the one hand, signals received from the testing and/or debugging interfaces 302-304 as a combined signal via the combiner 309 and, on the other hand, signals received from the camera module 330, the SD card driver 312 or the SD card controller 313 the signals received from the testing and/or debugging interfaces 302-304 and to output the selected signals to the memory card connector 314.

Not mapping pins of each of the testing and/or debugging interfaces 302-304 to the pins 321-328 of the memory card connector 314 may yield selecting only some signals from the combined signal comprising signals from more than one of the testing and/or debugging interfaces 302-304 received from the combiner 309. For pin mapping, the connection circuit 307 comprises decomposer (not shown) connected upstream of the multiplexer 308 and decompose, i.e. de-funnel, the combined signal into its components.

However, the media module monitor 311 is configured to, upon being notified that a testing and/or debugging apparatus has been connected to the memory card connector 314, enable access to the testing and/or debugging interfaces 302-304 only if it has received a valid security certificate from the testing and/or debugging apparatus via the memory card connector 314, the SD card controller 313 and the SD card driver 312.

The necessity of receiving a valid security certificate before access to the testing and/or debugging interface is enabled may serve for preventing an unauthorized person from tampering with the ASIC 301 by means of the testing and/or debugging interfaces 302-304. For instance, it may be desired to not grant an end-user access to the testing and/or debugging interface.

In the following table, the pin configuration of an eight pin microSD card connector is illustrated.

| pin name | type | signal function (SD mode) |
| --- | --- | --- |
| DAT2 | I/O/PP | data bit 2 |
| CD/DAT3 | I/O/PP | card detect/data bit 3 |
| CMD | PP | command line |
| Vdd | S | supply voltage 2.7 V/3.6 V |
| CLK | I | clock |
| Vss | S | ground |
| DAT0 | I/O/PP | data bit 0 |
| DAT1 | I/O/PP | data bit 1 |

Therein, the pin names are listed together with the pin types input (I), output (O), push-pull (PP), and supply (S) of the respective pin, and the signal function.

Different pin overlay modes varying in the selected predefined mapping scheme may be defined. In the following two tables, five exemplary pin overlay modes are listed. In the normal mode of the apparatus 300, the media module monitor 311 controls the multiplexer 308 to map the pins of the SD card controller 313 to the pins 321-328 of the SD card connector 314.

| pin # | normal | system trace | run control |
| --- | --- | --- | --- |
| Pin 321 | DAT2 | MIPI_PTI_DAT2 | TMSC |
| Pin 322 | DAT3 | MIPI_PTI_DAT3 | TCKC |
| Pin 323 | CMD | RXD (MIPI STP return channel) | RXD |
| Pin 324 | VDD | VDD | VDD |
| Pin 325 | CLK | MIPI_PTI_CLK | MIPI_PTI_CLK |
| Pin 326 | GND | GND | GND |
| Pin 327 | DAT0 | MIPI_PTI_DAT0 | MIPI_PTI_DAT0 |
| Pin 328 | DAT1 | MIPI_PTI_DAT1 | MIPI_PTI_DAT1 |

| pin # | normal | legacy run control | system trace and run control |
| --- | --- | --- | --- |
| Pin 321 | DAT2 | TMS | MIPI_PTI_DAT2 |
| Pin 322 | DAT3 | TCK | MIPI_PTI_DAT3 |
| Pin 323 | CMD | TDI | TMSC |
| Pin 324 | VDD | VDD | VDD |
| Pin 325 | CLK | RTCK | TCKC |
| Pin 326 | GND | GND | GND |
| Pin 327 | DAT0 | TDO | MIPI_PTI_DAT0 |
| Pin 328 | DAT1 | nRESET | MIPI_PTI_DAT1 |

Instead of the combiner 309 the apparatus 300 may also comprise a selector configured to select one of a signal received from the ETM/PTM interface 302, a signal received from the STM interface 303 and a signal received from the cJTAG interface 304 and to output the selected signal. In this case, de-funnelling in the connection circuit 307 is not necessary.

Via a connection between the SD card controller 313 and the memory card connector bypassing the connection circuit 307, the SD card controller 313 may, even in the testing and/or debugging mode of the apparatus 30, monitor the memory card connector 314 in order to determine whether the testing and/or debugging apparatus has been disconnected from the memory card connector 314.

Figure 4:
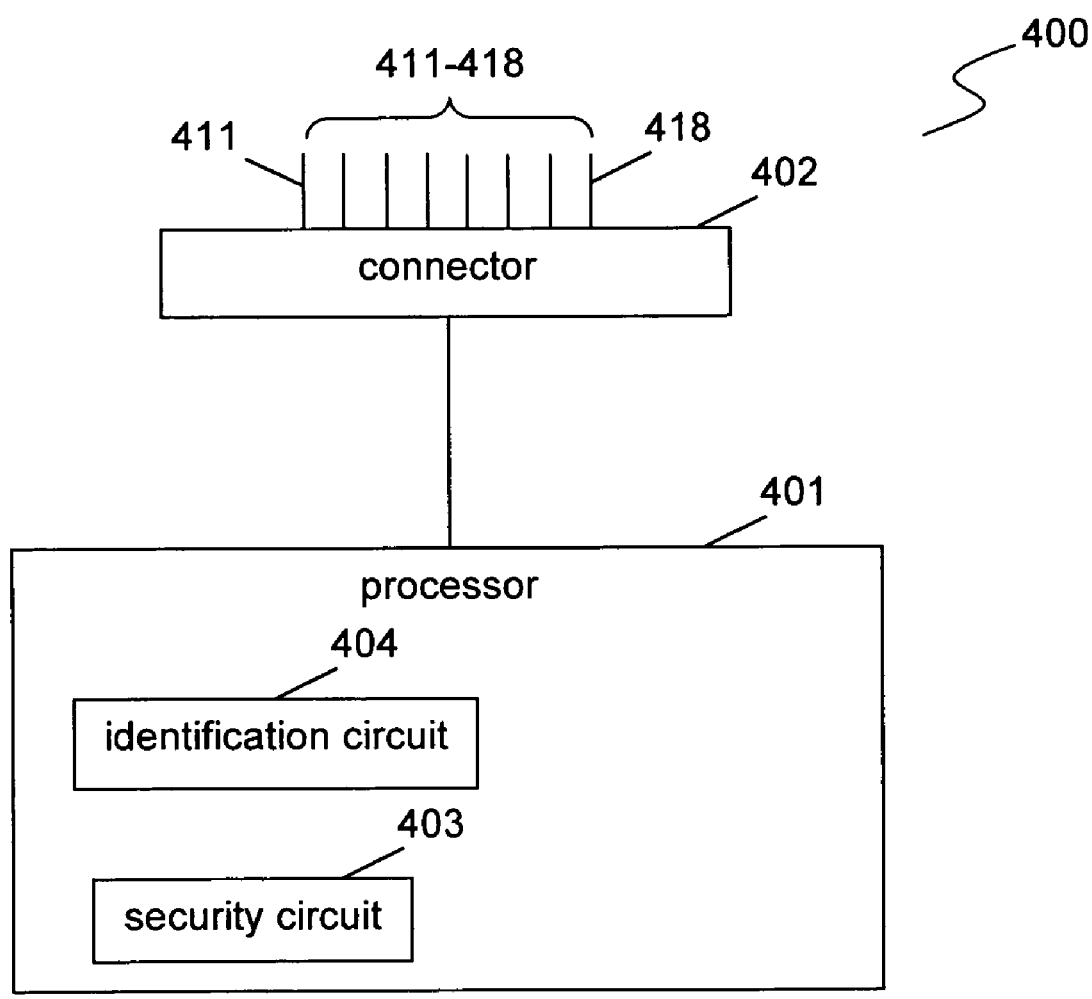
FIG. 4: An exemplary illustration of a second embodiment of a testing and/or debugging apparatus according to the second aspect of the present invention which is connectable to the apparatus of FIG. 3.

FIG. 4 shows an exemplary illustration of a second embodiment of a testing and/or debugging apparatus 400 according to the second aspect of the present invention which is connectable to the apparatus of FIG. 3.

The testing and/or debugging apparatus 400 comprises a processor 401 and a connector 402 which has eight pins 411-418. The processor 401 comprises an identification circuit 404 and a security circuit 403.

By means of the connector 402, the testing and/or debugging apparatus 400 is connectable to apparatus 300 of FIG. 3. To this end, the shape of the connector 402 resembles the shape of a microSD card. By connecting the connector 402 of the testing and/or debugging apparatus 400 to the memory card connector 314 of the apparatus 300, an electrical contact of the pins 321-328 and the respective pins 411-418 is made.

The processor 401 is configured to communicate with the testing and/or debugging interfaces 302-304 of the apparatus 300 via the connector 314 if the apparatus 300 is in the testing and/or debugging mode.

The processor 401 is configured to respond to requests issued by the controller 310 according to the initialization protocol automatically executed by the controller 310, the initialization protocol being configured to initialize an microSD card independently of whether an microSD card or the testing and/or debugging apparatus 400 is connected to the memory card connector 314, in a manner allowing the controller 310 to assume a state in which it is configured to receive and process the identifier, i.e. the state in which the controller 310 awaits a response to the CMD2 issued by the SD card driver 312 and the SD card controller 313 as explained with respect to the embodiment depicted in FIG. 3.

The processor 401 is configured to transmit an identifier to the controller 310 of the apparatus 300 via the connector 314, the identifier identifying the testing and/or debugging apparatus 400 as a testing and/or debugging apparatus. To this end, the identification circuit 404 is provided. In the present example, the identifier is a unique CID that is generally not assigned to microSD cards.

The processor 401 is configured to transmit a security certificate to the apparatus 300 comprising the testing and/or debugging interface via the memory card connector 314. To this end, the security circuit 403 is provided. Thus, the processor 401 is also configured to cause a security certificate to be transmitted to apparatus 300. In other embodiments, the processor configured to cause a security certificate to be transmitted to the apparatus 300 and a separate transmitter operationally coupled to the processor configured to cause a security certificate to be transmitted to the apparatus 300 may be provided. Such a transmitter does not necessarily have to form part of the testing and/or debugging apparatus 400. It may also be an external apparatus or module. By means of the identifier, it can be determined whether a microSD card or the testing and/or debugging apparatus 400 is connected to the memory card connector 314. Having determined that the testing and/or debugging apparatus 400 is connected to the memory card connector 314, a connection between the testing and/or debugging interfaces 302-304 and the memory card connector 314 can be established.

If a microSD card has been connected to the memory card connector 314, execution of the initialization protocol may yield initialization of the microSD card without the need for further actions by a user who has connected the microSD card to the memory card connector 314. This may contribute to a good user experience.

Yet, even if the testing and/or debugging apparatus 400 has been connected to the memory card connector 314, the initialization protocol configured to initialize the microSD card is automatically executed. Therefore, it is initially not necessary for the apparatus 300 to distinguish between a scenario in which a microSD card has been connected to the memory card connector 314 and a scenario in which the testing and/or debugging apparatus 400 has been connected to the memory card connector 314. With a distinguishing step not being necessary, having been connected to the memory card connector 314, the microSD card may be initialized quickly. Furthermore, the possibility of automatically establishing a connection between the testing and/or debugging interfaces 302-304 and the memory card connector 314 if the testing and/or debugging apparatus 400 has been connected to the memory card connector 314 may not affect how the apparatus 300 behaves upon connecting a microSD card. Modifications of the initialization protocol configured to initialize a microSD card may be unnecessary.

With the testing and/or debugging apparatus 400 responding to requests issued by the apparatus 300 according to the initialization protocol in a manner allowing the apparatus 300 to assume a state in which it is configured to receive and process the identifier, a connection between the testing and/or debugging interfaces 302-304 and the memory card connector 314 may then be automatically established as a result of receiving and processing the identifier.

Combining signals from the testing and/or debugging interfaces 302-304 allows for efficiently providing signals from more than one of the testing and/or debugging interfaces 302-304 to the connection circuit 307 on a single bus 315. As the connection circuit 307 comprises a decomposer (not shown) configured to decompose the combined signal received from the combiner 307, a decomposer in the testing and/or debugging apparatus 400 is not provided.

Figure 5:
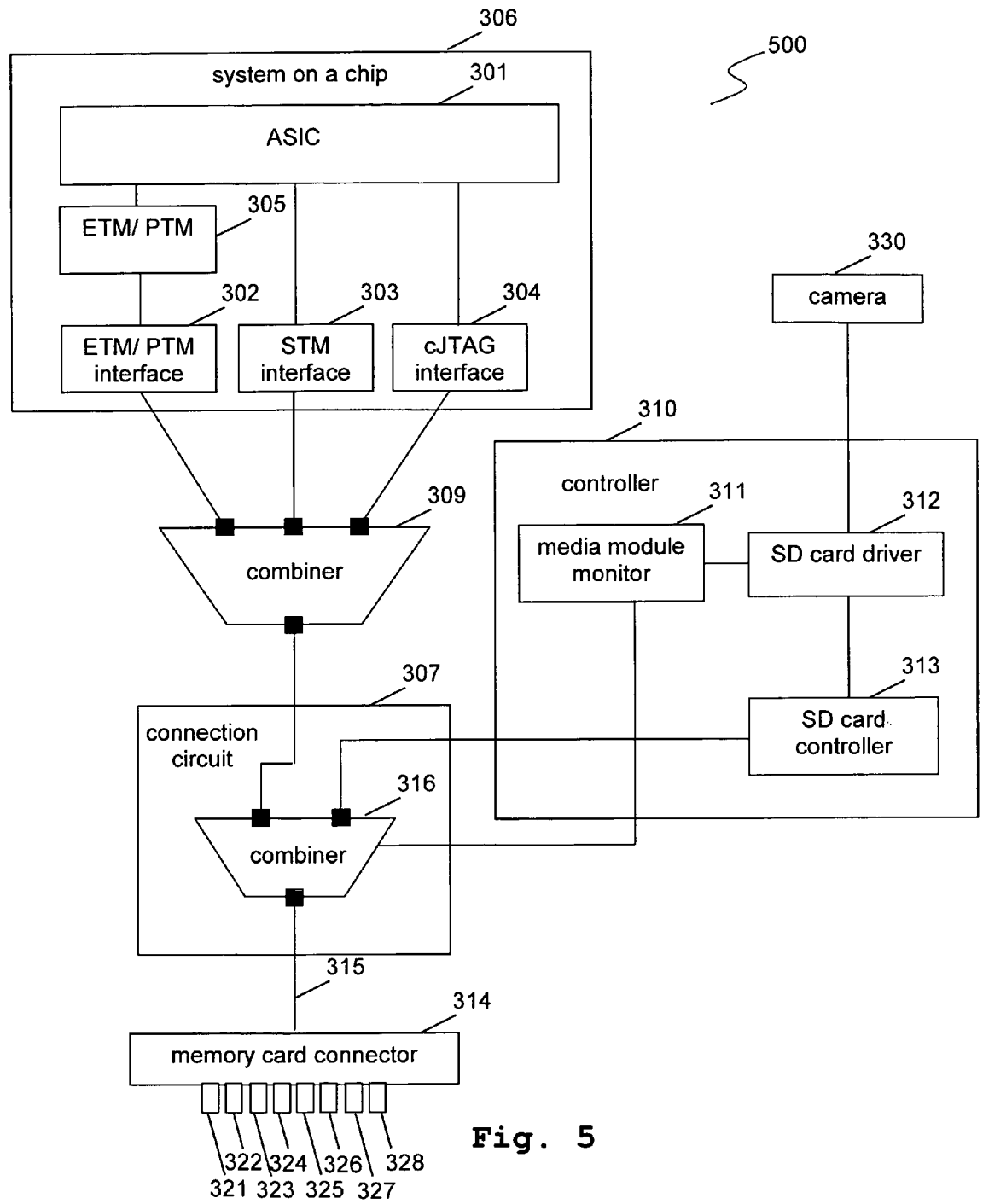
FIG. 5: An exemplary illustration of a third embodiment of an apparatus according to the first aspect of the present invention.

FIG. 5 shows an exemplary illustration of a third embodiment of an apparatus 500 according to the first aspect of the present invention.

In some aspects the apparatus 500 is similar to apparatus 300 depicted in FIG. 3. Therefore, only differences between apparatus 300 and apparatus 500 are explained hereinafter.

The connection circuit 307 of the apparatus 500 does not comprise a multiplexer but a combiner 316. The combiner 316 is configured to combine in the testing and/or debugging mode a signal received from the testing and/or debugging interfaces 302-304 and a signal received from the controller 310 and to output the combined signal on the bus 315. In the embodiment currently discussed, combining and outputting is carried out by funnelling a signal received from the testing and/or debugging interfaces 302-304 and a signal received from the controller 310 on the bus 315.

Having detected that a testing and/or debugging apparatus has been connected to the memory card connector 314, the SD card controller 313 is configured to issue the command SET_RELATIVE_ADDR (CMD3) to the testing and/or debugging apparatus to assign to the testing and/or debugging apparatus a relative card address (RCA), which is shorter than a CID and will be used to address the testing and/or debugging apparatus as it would address a microSD card for data transfer.

Having been notified that a testing and/or debugging apparatus has been connected to the memory card connector 314, the media module monitor 311 is configured to enable the combiner 316 of the connection circuit 307. Thus, a connection between the testing and/or debugging interfaces 302-304 and the memory card connector 314 is established because by enabling the combiner 316, signals from the testing and/or debugging interfaces 302-304 are now outputted on bus 315. Hence, enabling the combiner 316 may be understood as establishing the testing and/or debugging mode of the apparatus 300.

Data transfer between the testing and/or debugging apparatus and the apparatus 500 may be performed at a higher clock rate than data transfer between a microSD card and the apparatus 500.

Combining in the testing and/or debugging mode of the apparatus 500 a signal from the testing and/or debugging interface 302-304 received via the combiner 309 and a signal from the SD card controller 313 of the controller 310 and outputting the combined signal to the memory card connector 314 on the bus 315 may allow a testing and/or debugging apparatus connected to the memory card connector 314 to analyze both the signal from the testing and/or debugging interfaces 302-304 and the signal from the SD card controller 313. Since the camera module is operationally coupled to the SD card controller 313 via the SD card driver 312, a signal from the camera module 330 may also be analyzed by the testing and/or debugging apparatus.

The controller 310 is configured to control the connection circuit 307 to release the connection between the testing and/or debugging interfaces 302-304 and the memory card connector 314 if the testing and/or debugging apparatus is disconnected from the memory card connector 314, thereby terminating the testing and/or debugging mode of the apparatus 500. To this end, the SD card controller 313 is configured to detect disconnection of the testing and/or debugging apparatus. It is configured to subsequently notify the media module monitor 311 via the SD card driver 312 of the disconnection. The media module monitor 311 is configured to disable the combiner 316 in turn so that the combiner 316 merely forwards signals issued by the SD card controller 313 or transmitted to the SD card controller 313, for instance by a microSD card connected to memory card connector 314 later on. The connection between the testing and/or debugging interfaces and the memory card connector 314 is released and the testing and/or debugging mode is terminated. Thus, the apparatus 500 assumes the normal mode.

If a microSD card is connected to the memory card connector 314 after termination of the testing and/or debugging mode, initializing the microSD card and communicating with the microSD card may be performed in the same manner as if the testing and/or debugging apparatus had not been connected to the memory card connector 314 before and the testing and/or debugging mode had not been established. In other words, disconnecting the testing and/or debugging apparatus from the memory card connector 314 may cause the apparatus 500 to assume the state it had been in before the testing and/or debugging apparatus has been connected.

Figure 6:
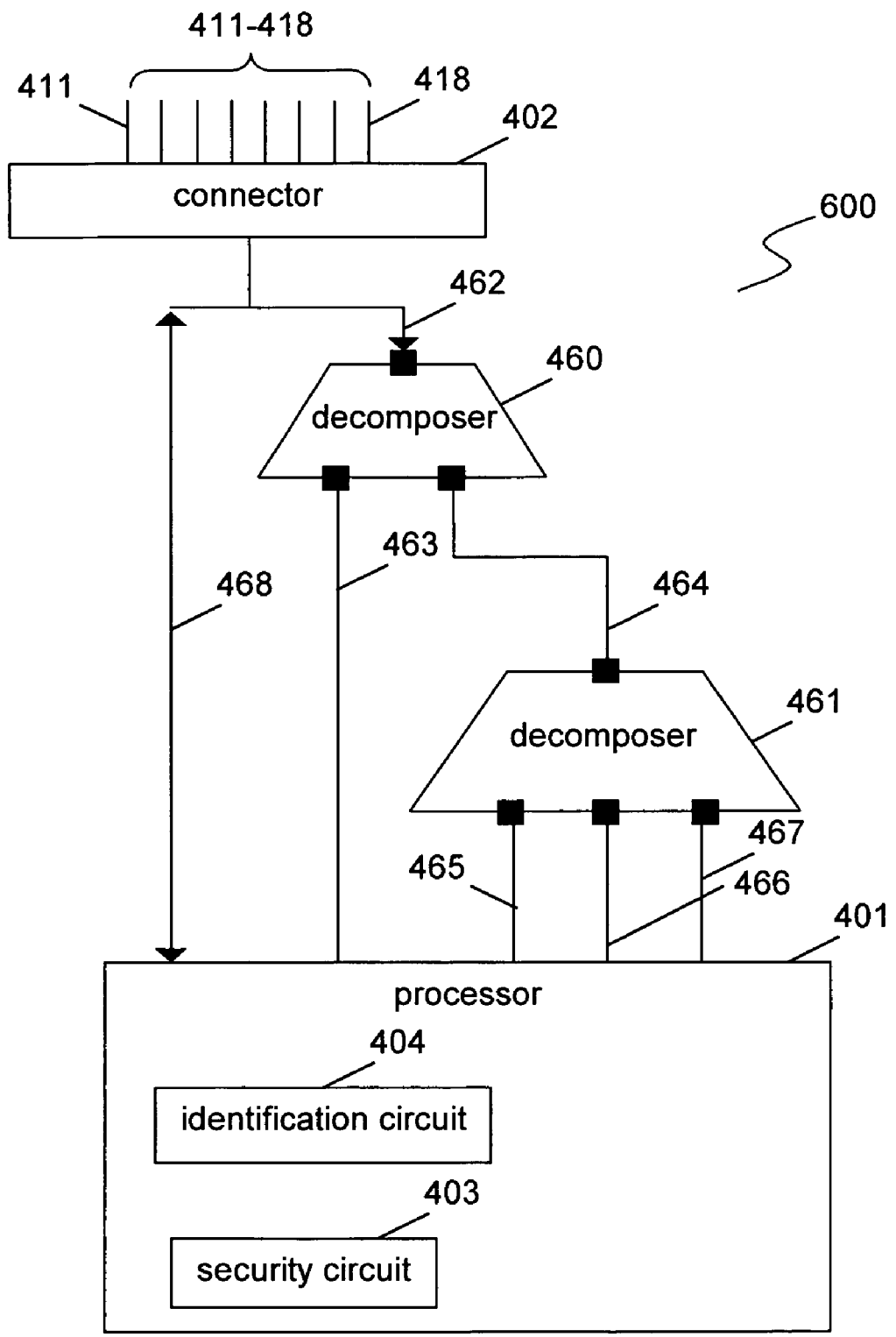
FIG. 6: An exemplary illustration of a third embodiment of a testing and/or debugging apparatus according to the second aspect of the present invention which is connectable to the apparatus of FIG. 5.

FIG. 6 shows an exemplary illustration of a third embodiment of a testing and/or debugging apparatus 600 according to the second aspect of the present invention which is connectable to the apparatus 500 of FIG. 5.

In some aspects the testing and/or debugging apparatus 600 is similar to testing and/or debugging apparatus 400 depicted in FIG. 4. Therefore, only differences between the testing and/or debugging apparatus 600 and the testing and/or debugging apparatus 400 are explained hereinafter.

The testing and/or debugging apparatus 600 comprises a first decomposer 460 and a second decomposer 461. The first decomposer 460 is connected to the connector 402 by, seen from the viewpoint of decomposer 460, the input bus 462. It has two output buses 463 and 464. The second decomposer 461 is connected to the output bus 464 of the first decomposer 460 and it has three output buses 465-467. A further bus 468 is provided.

The first decomposer 460 is configured to decompose a combined signal received from the apparatus 500 via the memory card connector 314, the combined signal comprising a combined signal from the testing and/or debugging interfaces 302-304 and a signal from the controller 310, into the combined signal from the testing and/or debugging interfaces 302-304 and the signal from the controller 310.

The decomposer 461 is configured to decompose, i.e. in the present case de-funnel, a combined signal received from the apparatus 300 via the memory card connector 314 and the first decomposer 460 on the bus 464, the combined signal comprising a signal from the ETM/PTM interface 302, a signal from the STM interface 303 and a signal from the cJTAG interface 304, into the signal from the ETM/PTM interface 302, the signal from the STM interface 303 and the signal from the cJTAG interface 304. On the output buses 465-467, the signal from the ETM/PTM interface 302, the signal from the STM interface 303 and the signal from the cJTAG interface 304 may be output to the processor 401.

Signals transmitted from the apparatus 500 that do not require decomposition, for instance signals transmitted from the controller 310 in the course of executing the initialization protocol configured to initialize a microSD card, may bypass the decomposers 460 and 461 and be conveyed to the processor 401 via the bus 468. The same holds for signals transmitted from the processor 401 to the apparatus 500, such as, for instance, an identifier.

The apparatus 500 may also comprise a decomposer (not shown) interposed between the testing and/or debugging interfaces 302-304 on the one side and the connection circuit 307 on the other side, the decomposer configured to decompose a combined signal received from the testing and/or debugging apparatus 600 via the memory card connector 314, the combined signal comprising a signal addressed to a first testing and/or debugging interface of the testing and/or debugging interfaces 302-304 and a signal addressed to a second testing and/or debugging of the testing and/or debugging interfaces 302-304, into the signal addressed to the first testing and/or debugging interface and the signal addressed to the second testing and/or debugging interface.

Moreover, the apparatus 500 may also comprise a decomposer (not shown), the decomposer configured to decompose a combined signal received from the testing and/or debugging apparatus 600 via the memory card connector 314, the combined signal comprising a signal addressed to at least one of the testing and/or debugging interfaces 302-304 and a signal addressed to the controller 310, into the signal addressed to at least one of the testing and/or debugging interfaces 302-304 and the signal addressed to controller 310.

The testing and/or debugging apparatus 600 may also comprise a combiner (not shown), the combiner being configured to combine a signal addressed to a first testing and/or debugging interface of the testing and/or debugging interfaces 302-304 and a signal addressed to a second testing and/or debugging interface of the testing and/or debugging interfaces 302-304 and to output the combined signal.

Furthermore, the testing and/or debugging apparatus 600 may also comprise a combiner (not shown), the combiner being configured to combine a signal addressed to at least one of the testing and/or debugging interfaces 302-304 and a signal addressed to the controller 310 and to output the combined signal.

By providing these additional combiners and decomposers, the testing and/or debugging apparatus 600 may generate a combined signal comprising a signal addressed to a first testing and/or debugging interface of the testing and/or debugging interfaces 302-304 and a signal addressed to a second testing and/or debugging interface of the testing and/or debugging interfaces 302-304 and output the combined signal, for example on the bus 468. The combined signal may be decomposed on part of the apparatus 500. This may allow, for instance, efficiently providing at least two signals from the testing and/or debugging apparatus to different testing and/or debugging interfaces on a single bus.

Furthermore, the possibility to combine the combined signal comprising a signal addressed to a first testing and/or debugging interface of the testing and/or debugging interfaces 302-304 and a signal addressed to a second testing and/or debugging interface of the testing and/or debugging interfaces 302-304 with a signal addressed to the controller 310 may become available.

The combined signal thus generated may be decomposed on part of the apparatus 500. Thereby, the first testing and/or debugging interface, the second testing and/or debugging interface or the controller 310 may be provided with the signals based on where the signals are addressed to. Targeted transmission of signals from the testing and/or debugging apparatus 600 to the testing and/or debugging interfaces and to the controller 310 is therefore possible.

Thus, in testing and/or debugging the ASIC 301 by means of the testing and/or debugging interfaces 302-304 and the testing and/or debugging apparatus 600, interactions between the ASIC 301 and the controller 310, the interactions being influenced by the signals transmitted to the controller 310, may also be analyzed.

Figure 7A:
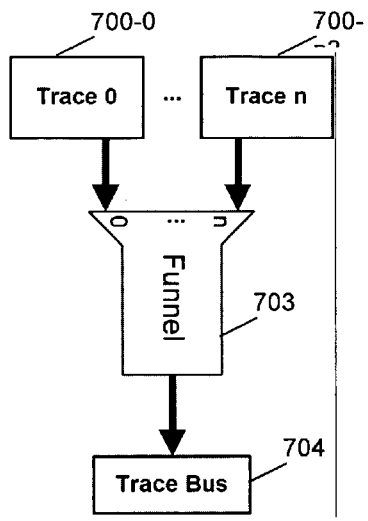
FIG. 7a: An exemplary illustration of a first trace funneling setup.

FIG. 7a shows an exemplary illustration of a first trace funneling setup.

According to FIG. 7a, n traces 700-0 to 700-n, i.e. testing and/or debugging information obtainable from one or more than one testing and/or debugging interface to an integrated circuit to one or more than one integrated circuit, may be combined by means of the funnel 703 on a single trace bus 704.

Figure 7B:
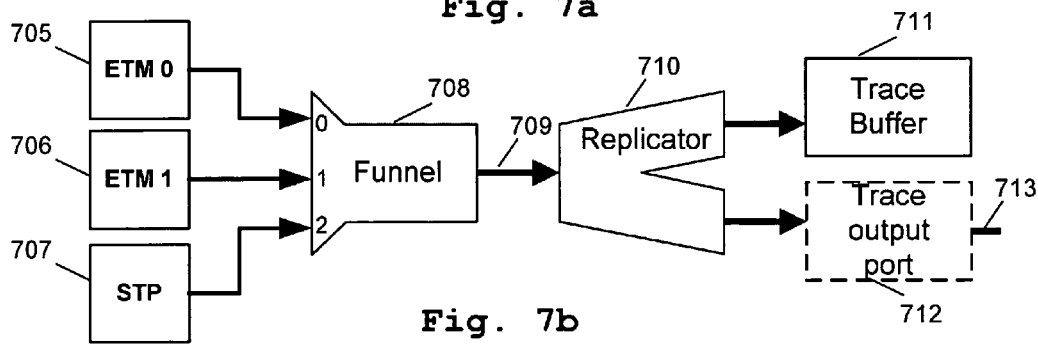
FIG. 7b: An exemplary illustration of a second trace funneling setup.

FIG. 7b shows an exemplary illustration of a second trace funneling setup.

Three traces 705-707 from three different testing and/or debugging interfaces are combined by funnel 708 and output as a combined signal on a single trace bus 709. A replicator 710 replicates the combined signal which is then fed to a trace buffer 711 and, via a trace output port 712, to a trace bus 713.

The traces 705-707 are merely exemplary traces from illustrative testing and/or debugging interfaces. For instance, according to the trace funnelling setup of FIG. 7b any processor trace may replace the ETM traces 705 and 706. Therein, the processor traces 705 and 706 do not need to stem from similar testing and/or debugging interfaces. To give an example, one of the traces 705 and 706 may be an PTM trace instead of an ETM trace. Likewise, the STP trace 707 may as well be any other instrumentation trace.

Testing and/or debugging interfaces may require a relatively large number of pins for communication purposes. Integrated circuits may be interfaced by a plurality of testing and/or debugging interfaces, for instance because the integrated circuit is a processor having a plurality of cores. If the integrated circuit interfaced by the plurality of testing and/or debugging interfaces and the testing and/or debugging interfaces are manufactured as a single module, said module may thus require a large number of pins as well. A silicon and pin overheads may be the consequence.

The trace funnel 708 is one of the solutions to combine multiple, asynchronous, heterogeneous trace streams into one combined signal, i.e. one trace stream, for output via a the single trace port 712 or storage in the trace buffer 711. The trace bus 713 may convey the combined signals to pins of the module.

The trace funnel 708 may thus serve for providing a data path from trace data generation to a file on a testing and/or debugging apparatus such as a developer's workstation. The trace data may be visualized for the respective trace generator, i.e. testing and or debugging interface, on part of the testing and/or debugging apparatus.

Each testing and/or debugging interface may be assigned an identifier to enable or simplify de-funneling.

The trace funnel 708 may be used as a static multiplexer, i.e. select m out of n sources. It may also be configured to allow assigning priorities to the trace streams 705, 706 and 707. This may enable a user to cope with a bandwidth of the trace bus 713 too limited for transmitting all of the trace streams 705-707.

Figure 7C:
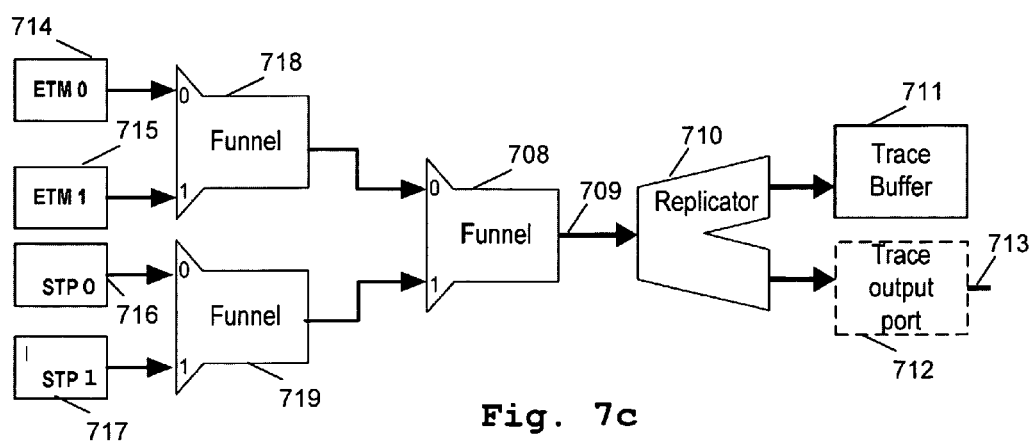
FIG. 7c: An exemplary illustration of a third trace funneling setup.

FIG. 7c shows an exemplary illustration of a third trace funneling setup.

In FIG. 7c, four traces 714-717 from four different testing and/or debugging interfaces are provided. Traces 714 and 715 are processor traces, while traces 716 and 717 are instrumentation traces. A funnel 718 funnels traces 714 and 715. Traces 716 and 717 are funnelled by a funnel 719. Hence, the funnels 718 and 719 do not need to handle heterogeneous trace streams. The combined signals from funnel 718 and from funnel 719 are then provided to funnel 708. From thereon, the trace funneling setup of FIG. 7c is identical to the trace funneling setup of FIG. 7b.

Figure 8:
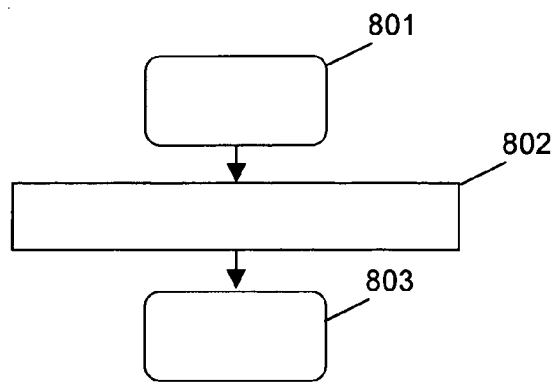
FIG. 8: A flowchart schematically illustrating a first embodiment of a method according to the third aspect of the present invention.

FIG. 8 is a flowchart schematically illustrating a first embodiment of a method according to the third aspect of the present invention.

Step 801 is the starting point. Step 802 comprises automatically establishing a connection between a connector of an apparatus, the apparatus comprising a testing and/or debugging interface to an integrated circuit, the connector being connectable to a testing and/or debugging apparatus configured to communicate with the testing and/or debugging interface in a testing and/or debugging mode of the apparatus and connectable to an accessory apparatus to be used in a normal operation mode of the apparatus, and the testing and/or debugging interface if the testing and/or debugging apparatus is connected to the connector, thereby establishing the testing and/or debugging mode of the apparatus. In step 803 the method terminates.

Figure 9:
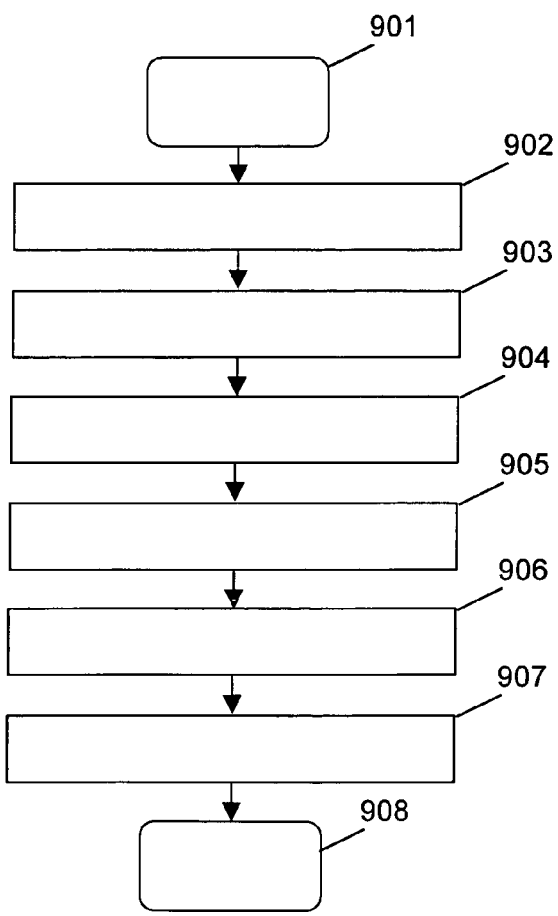
FIG. 9: A flowchart schematically illustrating a second embodiment of a method according to the third aspect of the present invention.

FIG. 9 is a flowchart schematically illustrating a second embodiment of a method according to the third aspect of the present invention.

Step 901 is the starting point. Step 902 comprises connecting a testing and/or debugging apparatus to a connector of an apparatus, the apparatus comprising a testing and/or debugging interface to an integrated circuit, the connector connectable to a testing and/or debugging apparatus configured to communicate with the testing and/or debugging interface in a testing and/or debugging mode of the apparatus and connectable to an accessory apparatus to be used in a normal operation mode of the apparatus.

Step 902 further comprises automatically executing an initialization protocol on the part of the apparatus, the initialization protocol being configured to initialize the accessory apparatus independently of whether the accessory apparatus or the testing and/or debugging apparatus is connected to the connector, and responding of the testing and/or debugging apparatus to requests issued by the apparatus according to the initialization protocol in a manner allowing the apparatus to assume a state in which it is configured to receive and process an identifier.

Subsequently, in step 903 the testing and/or debugging apparatus transmits an identifier via the connector, the identifier identifying the testing and/or debugging apparatus as a testing and/or debugging apparatus. The apparatus receives the identifier and processes it.

Step 904 comprises establishing a connection between a connector of the apparatus and the testing and/or debugging interface as a result of processing the identifier, thereby establishing the testing and/or debugging mode of the apparatus.

In step 905, the testing and/or debugging apparatus communicates with the testing and/or debugging interface. In the course thereof, requests for testing and/or debugging information are transmitted from the testing and/or debugging apparatus to the testing and/or debugging interface and testing and/or debugging information is transmitted from the testing and/or debugging interface to the testing and/or debugging apparatus.

Thereafter, in step 906, the testing and/or debugging apparatus is disconnected from the connector.

Step 907 comprises releasing the connection between the testing and/or debugging interface and the connector, thereby terminating the testing and/or debugging mode of the apparatus.

In step 908 the method terminates.

Figure 10:
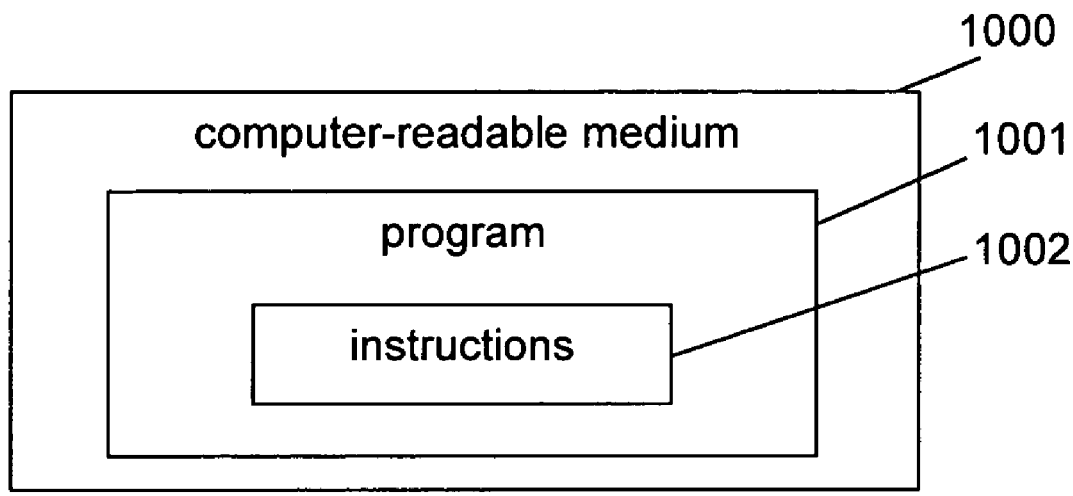
FIG. 10: A schematic illustration of an exemplary embodiment of a readable storage medium according to the fourth aspect of the present invention.

FIG. 10 shows a schematic illustration of an exemplary embodiment of a readable storage medium 1000 according to the fourth aspect of the present invention.

In this example the readable storage medium 1000 is a computer-readable storage medium. A program 1001 is stored thereon. The program 1001 comprises instructions 1002. When executed by a processor, the instructions 1002 perform automatically establishing a connection between a connector of an apparatus, the apparatus comprising a testing and/or debugging interface to an integrated circuit, the connector being connectable to a testing and/or debugging apparatus configured to communicate with the testing and/or debugging interface in a testing and/or debugging mode of the apparatus and connectable to an accessory apparatus to be used in a normal operation mode, and the testing and/or debugging interface if the testing and/or debugging apparatus is connected to the connector, thereby establishing the testing and/or debugging mode of the apparatus. To this end, the processor may resort to other entities.

The invention has been described above by means of exemplary embodiments. It should be noted that there are alternative ways and variations which are obvious to a skilled person in the art and can be implemented without deviating from the scope and spirit of the appended claims.

It is to be understood that with respect to all of the above embodiments that relate to a processor the processor may for instance be implemented in hardware alone, may have certain aspects in software alone, or may be a combination of hardware and software. The processor may either be a separate module or it may be a subcomponent of a module such as, for example, a processor or an application specific integrated circuit (ASIC) that has other functional components or structures, too.

Furthermore, it is readily clear for a skilled person that the logical blocks in the schematic block diagrams as well as the flowchart and algorithm steps presented in the above description may at least partially be implemented in electronic hardware and/or computer software, wherein it depends on the functionality of the logical block, flowchart step and algorithm step and on design constraints imposed on the respective devices to which degree a logical block, a flowchart step or algorithm step is implemented in hardware or software. The presented logical blocks, flowchart steps and algorithm steps may for instance be implemented in one or more digital signal processors, application specific integrated circuits, field programmable gate arrays or other programmable devices. The computer software may be stored in a variety of storage media of electric, magnetic, electromagnetic or optic type and may be read and executed by a processor, such as for instance a microprocessor. To this end, the processor and the storage medium may be coupled to interchange information, or the storage medium may be included in the processor.

What is claimed is:

1. An apparatus comprising:
   a dedicated testing and/or debugging interface to an integrated circuit;
   a connector connectable to a testing and/or debugging apparatus configured to communicate with the dedicated testing and/or debugging interface via the connector in a testing and/or debugging mode of the apparatus and connectable to an accessory apparatus to be used in a normal operation mode of the apparatus; and
   a connection circuit controllable by a controller;
   wherein the controller is:
      configured to automatically control the connection circuit to establish a connection between the dedicated testing and/or debugging interface and the connector based on an identifier received from the testing and/or debugging apparatus via the connector if the testing and/or debugging apparatus is connected to the connector, the identifier identifying the testing and/or debugging apparatus as a testing and/or debugging apparatus, thereby establishing the testing and/or debugging mode of the apparatus; and
      configured to automatically execute an initialization protocol, the initialization protocol being configured to initialize the accessory apparatus independently of whether the accessory apparatus or the testing and/or debugging apparatus is connected to the connector.

2. The apparatus of claim 1, wherein the controller is configured to control the connection circuit to release the connection between the dedicated testing and/or debugging interface and the connector if the testing and/or debugging apparatus is disconnected from the connector, thereby terminating the testing and/or debugging mode of the apparatus.

3. The apparatus of claim 1 comprising at least a first dedicated testing and/or debugging interface and a second dedicated testing and/or debugging interface to at least one integrated circuit, the apparatus further comprising at least one of:
   a selector interposed between the first dedicated testing and/or debugging interface and the second dedicated testing and/or debugging interface on the one side and the connection circuit on the other side, the selector being configured to select one of a signal received from the first dedicated testing and/or debugging interface and a signal received from the second dedicated testing and/or debugging interface and to output the selected signal; and
   a combiner interposed between the first dedicated testing and/or debugging interface and the second dedicated testing and/or debugging interface on the one side and the connection circuit on the other side, the combiner being configured to combine a signal received from the first dedicated testing and/or debugging interface and a signal received from the second dedicated testing and/or debugging interface and to output the combined signal.

4. The apparatus of claim 3 further comprising a decomposer interposed between the first dedicated testing and/or debugging interface and the second dedicated testing and/or debugging interface on the one side and the connection circuit on the other side, the decomposer configured to decompose a combined signal received from the testing and/or debugging apparatus via the connector, the combined signal comprising a signal addressed to the first dedicated testing and/or debugging interface and a signal addressed to the second dedicated testing and/or debugging interface, into the signal addressed to the first dedicated testing and/or debugging interface and the signal addressed to the second dedicated testing and/or debugging interface.

5. The apparatus of claim 1, wherein the connection circuit comprises at least one of:
   a selector, the selector being configured to select in the testing and/or debugging mode from
      a signal received from the dedicated testing and/or debugging interface and
      a signal received from an entity configured to communicate with the accessory apparatus in the normal mode of the apparatus if the accessory apparatus is connected to the connector
   the signal received from the dedicated testing and/or debugging interface and to output the selected signal; and
   a combiner, the combiner being configured to combine in the testing and/or debugging mode
      a signal received from the dedicated testing and/or debugging interface and
      a signal received from an entity configured to communicate with the accessory apparatus in the normal mode of the apparatus if the accessory apparatus is connected to the connector
   and to output the combined signal.

6. The apparatus of claim 5, wherein the connection circuit comprises the selector and wherein the controller is configured to control the selector to map pins of the dedicated testing and/or debugging interface to pins of the connector according to a predefined mapping scheme.

7. The apparatus of claim 1, wherein the connection circuit comprises a decomposer, the decomposer configured to decompose a combined signal received from the testing and/or debugging apparatus via the connector, the combined signal comprising a signal addressed to the dedicated testing and/or debugging interface and a signal addressed to an entity configured to communicate with the accessory apparatus in the normal mode of the apparatus if the accessory apparatus is connected to the connector, into the signal addressed to the dedicated testing and/or debugging interface and the signal addressed to the entity configured to communicate with the accessory apparatus in the normal mode of the apparatus if the accessory apparatus is connected to the connector.

8. The apparatus of claim 1, wherein the apparatus is configured to enable access to the dedicated testing and/or debugging interface only if the apparatus has received a valid security certificate from the testing and/or debugging apparatus.

9. The apparatus of claim 1 further comprising the testing and/or debugging apparatus.

10. The apparatus of claim 1, wherein the accessory apparatus comprises a storage medium.

11. The apparatus of claim 1, wherein the dedicated testing and/or debugging interface is one of:
an instrumentation trace interface;
a processor trace interface;
a Joint Test Action Group (JTAG) interface;
a compact Joint Test Action Group (cJTAG) interface; and
a Narrow Interface for Debug and Test (NIDnT).

12. A testing and/or debugging apparatus connectable to an apparatus, the apparatus comprising an integrated circuit, a dedicated testing and/or debugging interface to the integrated circuit, a connector connectable to the testing and/or debugging apparatus and connectable to an accessory apparatus to be used in a normal operation mode of the apparatus, a connection circuit controllable by a controller, wherein the controller is configured to automatically control the connection circuit to establish a connection between the dedicated testing and/or debugging interface and the connector if the testing and/or debugging apparatus is connected to the connector, thereby establishing a testing and/or debugging mode of the apparatus, and the controller, the testing and/or debugging apparatus comprising a processor configured to communicate with the dedicated testing and/or debugging interface via the connector if the apparatus is in the testing and/or debugging mode, the testing and/or debugging apparatus further comprising a processor configured to transmit an identifier to the controller of the apparatus via the connector, the identifier identifying the testing and/or debugging apparatus as a testing and/or debugging apparatus, and configured to respond to requests issued by the controller according to an initialization protocol automatically executed by the controller, the initialization protocol being configured to initialize the accessory apparatus independently of whether the accessory apparatus or the testing and/or debugging apparatus is connected to the connector, in a manner allowing the controller to assume a state in which it is configured to receive and process the identifier.

13. A method comprising:
automatically establishing a connection between a connector of an apparatus, the apparatus comprising a dedicated testing and/or debugging interface to an integrated circuit, the connector being connectable to a testing and/or debugging apparatus configured to communicate with the dedicated testing and/or debugging interface in a testing and/or debugging mode of the apparatus and connectable to an accessory apparatus to be used in a normal operation mode of the apparatus, and the dedicated testing and/or debugging interface if the testing and/or debugging apparatus is connected to the connector, thereby establishing the testing and/or debugging mode of the apparatus, wherein establishing a connection between the dedicated testing and/or debugging interface and the connector is based on an identifier received by the apparatus from the testing and/or debugging apparatus via the connector if the testing and/or debugging apparatus is connected to the connector, the identifier identifying the testing and/or debugging apparatus as a testing and/or debugging apparatus; and
automatically executing an initialization protocol on the part of the apparatus, the initialization protocol being configured to initialize the accessory apparatus independently of whether the accessory apparatus or the testing and/or debugging apparatus is connected to the connector, and responding of the testing and/or debugging apparatus to requests issued by the apparatus according to the initialization protocol in a manner allowing the apparatus to assume a state in which it is configured to receive and process the identifier.

14. A non-transitory storage medium encoded with instructions that, when executed by a processor, perform automatically establishing a connection between a connector of an apparatus, the apparatus comprising a dedicated testing and/or debugging interface to an integrated circuit, the connector being connectable to a testing and/or debugging apparatus configured to communicate with the dedicated testing and/or debugging interface in a testing and/or debugging mode of the apparatus and connectable to an accessory apparatus to be used in a normal operation mode, and the dedicated testing and/or debugging interface if the testing and/or debugging apparatus is connected to the connector, thereby establishing the testing and/or debugging mode of the apparatus, wherein establishing a connection between the dedicated testing and/or debugging interface and the connector is based on an identifier received by the processor from the testing and/or debugging apparatus via the connector if the testing and/or debugging apparatus is connected to the connector, the identifier identifying the testing and/or debugging apparatus as a testing and/or debugging apparatus, and wherein the instructions, when executed by a processor, perform automatically executing an initialization protocol, the initialization protocol being configured to initialize the accessory apparatus independently of whether the accessory apparatus or the testing and/or debugging apparatus is connected to the connector.

* * * * *